(12) United States Patent
Mine et al.

(10) Patent No.: US 6,723,625 B2
(45) Date of Patent: Apr. 20, 2004

(54) SEMICONDUCTOR DEVICE HAVING THIN ELECTRODE LAYE ADJACENT GATE INSULATOR AND METHOD OF MANUFACTURE

(75) Inventors: Toshiyuki Mine, Fussa (JP); Jiro Yugami, Yokohama (JP); Takashi Kobayashi, Tokorozawa (JP); Masahiro Ushiyama, Kodaira (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/251,753

(22) Filed: Sep. 23, 2002

(65) Prior Publication Data

US 2003/0022444 A1 Jan. 30, 2003

Related U.S. Application Data

(62) Division of application No. 09/520,346, filed on Mar. 7, 2000, now Pat. No. 6,521,943, which is a continuation of application No. 09/041,793, filed on Mar. 13, 1998, now Pat. No. 6,144,062.

(30) Foreign Application Priority Data

Mar. 19, 1997 (JP) .............................................. 9-065704

(51) Int. Cl.[7] .............................................. H01L 21/336
(52) U.S. Cl. ...................... 438/592; 438/593; 438/652; 438/657
(58) Field of Search ................................. 438/592, 593, 438/652, 657, FOR 203; 257/317, 364, 407

(56) References Cited

U.S. PATENT DOCUMENTS 5,256,894 A  10/1993  Shino
5,272,099 A  12/1993  Chou et al.
5,289,026 A   2/1994  Ong (List continued on next page.)

FOREIGN PATENT DOCUMENTS

| EP | 0296418 | 12/1988 |
|----|---------|---------|
| GB | 2542960 | 10/1992 |
| JP | 6324644 | 2/1988 |
| JP | 402098173 | 4/1990 |
| JP | 406177396 | 6/1994 |

OTHER PUBLICATIONS

S.K. Ghandhi, VLSI Fabrication Principles, 1994, John Wiley & Sons, pp. 13–15.

*Primary Examiner*—George Fourson
*Assistant Examiner*—Joannie Adelle Garcia
(74) *Attorney, Agent, or Firm*—Antonelli, Terry, Stout & Kraus, LLP

(57) ABSTRACT

Disclosed is a semiconductor device (e.g., nonvolatile semiconductor memory device) and method of forming the device. The device includes a gate electrode (e.g., floating gate electrode) having a first layer of an amorphous silicon film, or a polycrystalline silicon thin film or a film of a combination of amorphous and polycrystalline silicon, on the gate insulating film. Where the film includes polycrystalline silicon, the thickness of the film is less than 10 nm. A thicker polycrystalline silicon film can be provided on or overlying the first layer. The memory device can increase the write/erase current significantly without increasing the low electric field leakage current after application of stresses, which in turn reduces write/erase time substantially. In forming the semiconductor device, a thin amorphous or polycrystalline silicon film can be provided on the gate insulating film, and a thin insulating film provided on the amorphous silicon film, with a thicker polycrystalline silicon film provided on or overlying the thin insulating film. Where the thin silicon film is amorphous silicon, it can then be polycrystallized, although it need not be. Also disclosed is a technique for selective crystallization of amorphous silicon layers, based upon layer thickness.

25 Claims, 22 Drawing Sheets

U.S. PATENT DOCUMENTS

| | | |
|---|---|---|
| 5,441,904 A | 8/1995 | Kim et al. |
| 5,481,128 A | 1/1996 | Hong |
| 5,557,122 A | 9/1996 | Shrivastava et al. |
| 5,639,679 A | 6/1997 | Muramatu |
| 5,661,687 A | 8/1997 | Randazzo |
| 5,789,296 A | 8/1998 | Sung et al. |
| 5,814,543 A | 9/1998 | Nishimoto et al. |
| 5,840,607 A | 11/1998 | Yeh et al. |
| 5,915,174 A * | 6/1999 | Yamazaki et al. .......... 438/166 |
| 5,923,968 A * | 7/1999 | Yamazaki et al. .......... 438/166 |
| 5,937,282 A * | 8/1999 | Nakajima et al. ........... 438/149 |
| 5,956,581 A * | 9/1999 | Yamazaki et al. .......... 438/166 |
| 5,972,105 A * | 10/1999 | Yamazaki et al. .............. 117/8 |
| 5,981,364 A | 11/1999 | Ramsbey et al. |
| 6,114,230 A * | 9/2000 | Chang et al. ............... 438/593 |
| 6,140,246 A * | 10/2000 | Chang et al. ............... 438/706 |

\* cited by examiner

|  | No1 | No2 | No3 | No4 | No5 | No6 | No7 |
|---|---|---|---|---|---|---|---|
| Gate oxide | Pyrogenic oxidation 850°C, 7.7nm | | | | | | |
| Lower gate (ultra thin Si) | None | 2nm | 4nm | 6nm | 8nm | None | 4nm |
| Upper gate | Phosphrous doped amorphous-Si (525°C, Si2H6 - PH3, 200nm) | | | | | | |
| N2 Anneal-1 | 750°C, 40min | | | | | | |
| N2 Anneal-2 | 900°C, 120min | | | | | | None |

SEMICONDUCTOR DEVICE HAVING THIN ELECTRODE LAYE ADJACENT GATE INSULATOR AND METHOD OF MANUFACTURE

This application is a Divisional application of application Ser. No. 09/520,346, filed Mar. 7, 2000, now U.S. Pat. No. 6,521,943 which is a Continuation application of application Ser. No. 09/041,793, filed Mar. 13, 1998, now U.S. Pat. No. 6,144,062, issued Nov. 7, 2000, the contents of which are incorporated herein by reference in their entirety.

BACKGROUND OF THE INVENTION

The present invention relates to a semiconductor device having an MIS type structure, and, more specifically, to a nonvolatile semiconductor memory device and a method of manufacture thereof.

Nonvolatile semiconductor memory devices are usually formed as semiconductor integrated circuit devices. A typical example of such a device is a flash memory device that can be electrically written and erased. The flash memory device is described, for example, in Japanese Patent Laid-Open No. 276878/1987 and 219496/1991 and a paper by Kume, entitled "A 1.28 $\mu m^2$ Contactless Memory Cell Technology for a 3V-Only 64 Mbit EEPROM," *IEDM*, 1992, 92–991 to 92–993.

FIG. 10 shows a cross-sectional structure of a main portion of a proposed (comparative) flash memory device. The main part of the memory often employs a so-called stack structure. The stack structure generally refers to a structure in which a capacitor for memory is formed over an electric switch circuit. In FIG. 10, reference number 601 represents a single crystal silicon substrate, 602 a device isolation oxide film, 603 a gate oxide film (tunnel insulating film), 606 a floating gate electrode, 607 an inter-layer insulating film, 608 a control gate electrode, 610 a source, 611 a drain, 609, 612 and 613 insulating films, 614 a source interconnect, and 615 a drain interconnect.

The construction of the main part of this memory will be described in detail. The gate oxide film 603 uses a silicon oxide film about 7.5–10 nm thick, which is generally formed by thermally oxidizing a silicon substrate. The floating gate electrode 606 is made of a polycrystalline silicon film doped with a high concentration of phosphorus and has a thickness of about 50 to 200 nm. The inter-layer insulating film 607 uses a laminated film 607 of $SiO_2$ film/$Si_3N_4$ film/$SiO_2$ film formed by low pressure chemical vapor deposition (LP-CVD). This laminated film 607 (of $SiO_2$ film/$Si_3N_4$ film/$SiO_2$ film) is generally called an ONO film (This abbreviation "ONO film" will be used hereinafter).

A first state of information in this flash memory—for example, writing of information-is accomplished as follows. The drain 611 is set to a positive bias (for example +4V), the control gate electrode 608 is set to a negative bias (for example –10V), the source 610 is open, and the silicon substrate 601 is set to 0V. In this state, electrons stored in the floating gate electrode 606 are pulled out toward the drain 611 side, thus writing information. These voltages are each applied by using pulses about 100 microseconds long. With this method the electrons in the floating gate electrode 606 are pulled out toward the drain 611 by a Fowler-Nordheim tunneling current (hereinafter abbreviated F-N current).

A second state of information, for example, erasing of information, is done as follows. The control gate electrode 608 is set to a positive bias (for instance +10V), the silicon substrate 601 is set to a negative bias (for instance –4V), and the source 610 and the drain 611 are set to an open state. In this state, electrons are injected into the floating gate electrode 606 from the silicon substrate 601, erasing the information. These voltages are applied by using pulses about 100 microseconds long.

While the holding of information in the first state is referred to as writing and that in the second state is referred to as erasing, these states of electric charge may be called in an opposite way. Naming of these states depends on how the electric charge operates. Whatever they are called, the same states have the same problem. In the following description, the writing and erasing refer to the states of charge as described above for the purpose of facilitating the understanding of explanation. It should be noted that the description of this invention also applies to the case of a charge operation where the states of charge are called in a way opposite to this specification, by reading each of the charge states in this specification to mean the same but oppositely called state.

UK patent application No. 2,254,960 discloses an MOS device having reduced susceptibility to oxide degradation at high integration levels, the device having an improved breakdown voltage by preventing reaction between the gate oxide material and doped impurity used to improve the electrical conductivity of the gate. The gate, made of polycrystalline silicon, includes an upper polycrystalline silicon layer and a lower polycrystalline silicon layer, the lower layer having a larger grain size than the upper layer. The gate can be formed by initially forming an amorphous (lower) silicon layer and a polycrystalline silicon layer thereon, doping an impurity into the polycrystalline silicon layer and converting the amorphous silicon layer to a polycrystalline silicon layer, to form the layers having the necessary grain sizes. Illustratively, the amorphous silicon layer, converted to polycrystalline silicon, has a thickness of 20–100 nm.

SUMMARY OF THE INVENTION

Problems to be Solved by the Invention

Writing and erasing of information in a flash memory is performed by injecting electrons into and pulling them out of the floating gate through the gate insulating film. The write/erase time or programming time depends on the Fowler-Nordheim tunneling current (F-N current) that flows in the gate insulating film. Because the F-N current depends largely on the thickness of the gate insulating film, the write/erase time decreases as the gate insulating film becomes thin. A reduction in thickness of the gate insulating film, however, induces the following problem, which is briefly explained by referring to the drawings.

FIG. 15 shows an electric field-current characteristic of an MOS capacitor before and after having constant current (F-N current) stresses applied thereto. The application of stresses means a test method for acceleratedly simulating stresses that would occur in the actual mounted state. That is, this method involves injecting a predetermined amount of charge into a memory cell and comparing the memory characteristics before and after the charge injection. The charge injection in this case is called stress application.

In FIG. 15, the solid line A represents a characteristic before the stress application and the dotted line B represents a characteristic after the stress application. In this example, an injection current density is 0.1 A/cm$^2$ and an injected charge density is 1 C/cm$^2$. As shown in FIG. 15, the leakage current of the MOS capacitor after stress application increases in a low electric field region (for example, below ±8 MV/cm). This is explained as follows. When the F-N current is injected into the gate insulating film for the application of stresses, holes injected into the gate insulating film form a new level in the gate insulating film and the leakage current through this level increases.

The leakage current in the low electric field region is the major cause for deterioration of the charge retention characteristics of flash memories. That is, the concrete causes of degraded charge retention characteristics include what are generally called a retention failure of flash memory (leakage of charge from the floating gate to the substrate side) and a disturbance failure (leakage from the substrate side to the floating gate side).

FIG. 16 shows the relation between the thickness of a gate insulating film and the current density in a flash memory cell. The characteristic given by black dots represents the relation between the thickness of a gate insulating film and the F-N current, and the characteristic given by blank dots represents the relation between the thickness of a gate insulating film and the leakage current at a low electric field. As can be seen from FIG. 16, the leakage current at the low electric field can be controlled by increasing the thickness of the gate insulating film. The leakage current at the low electric field and the F-N current are, however, in a trade-off relationship with respect to the thickness of the gate insulating film. Increasing the thickness of the gate insulating film therefore reduces the F-N current, giving rise to a new problem of increased programming (write/erase) time.

As a means to solve this problem, a method is proposed that introduces a trace amount of nitrogen into the conventional thermally oxidized film to suppress the leakage current at a low electric field. One such example is described in *IEEE Electron Device Letters*, Vol. 12, No. 11, p587, November 1991. Even with this method, a sufficient level to ensure a desirable charge retention characteristic has not been reached.

An object of this invention is to provide a semiconductor device (e.g., a nonvolatile semiconductor device, such as a nonvolatile semiconductor memory, but not limited thereto), which increases the F-N current while at the same time suppressing the leakage current, at a low electric field in a gate insulating film, caused by programming. Another object of this invention is to provide a method of manufacturing such a semiconductor device. This invention therefore can provide a nonvolatile semiconductor device that has high reliability and high-speed programming capability.

Means for Solving the Problems

Representative aspects of this invention disclosed in this specification may be summarized as follows. These representative aspects are illustrative, and not limiting, of the present invention, which is defined by the appended claims.

The semiconductor device according to one aspect of the present invention has a gate electrode (e.g., floating gate electrode), on a gate insulating film on a semiconductor (e.g., silicon) substrate, that includes a first layer of amorphous silicon or polycrystalline silicon or combination (e.g., mixture, i.e., partially crystallized silicon) of amorphous and polycrystalline silicon, on (in contact with) the gate insulating film, the first layer having a thickness less than 10 nm, preferably less than 8 nm. According to another aspect of the present invention, the first layer is made of amorphous silicon, without regard to the thickness thereof.

According to the first aspect of the present invention, the thickness of the first layer, when containing polycrystalline silicon, in contact with the gate insulating film, is less than 10 nm, preferably less than 8 nm. While not to be limiting, desirably the first layer has a minimum thickness of 1 nm, due to manufacturing considerations.

Another aspect of the present invention is a method of forming this semiconductor device. An amorphous or polycrystalline silicon film (a lower layer) of a thickness of less than 10 nm (preferably, less than 8 nm) is provided on a gate insulating film on a semiconductor substrate, and thereafter a thin insulating film (e.g., a silicon oxide film, of 0.3 to 1 nm) is provided on the amorphous or polycrystalline silicon. Then a doped polycrystalline silicon film is provided on the thin insulating film. During subsequent heat treatments (e.g., annealing, thermal oxidation, etc.) in the manufacturing process, the amorphous silicon film can be formed into a polycrystalline silicon thin film (or can remain an amorphous silicon film), and the thin insulating film can be eliminated. Moreover, during the subsequent heat treatments, impurity dopants from the doped polycrystalline silicon film can diffuse into the lower layer on the gate insulating layer, so a to make this lower layer (amorphous silicon, polycrystalline silicon or combination thereof) conductive. In this regard, the lower layer can be formed doped or non-doped. According to another aspect of the present invention, where the lower layer on the gate insulating film remains an amorphous silicon film, the lower layer is not limited with respect to thickness.

The semiconductor device in another aspect of this invention is characterized by an electrically erasable and programmable nonvolatile semiconductor device (e.g., a memory), which includes at least a floating gate electrode and a control gate electrode, the floating gate electrode being formed over a gate insulating film and including at least an amorphous or polycrystalline silicon film with an average thickness of less than 10 nm, more preferably less than 8 nm, the control gate electrode being formed over the floating gate electrode through an interlayer insulating film so that at least a part of the control gate electrode overlaps the floating gate electrode; and a method of fabricating this semiconductor device. The advantage of this invention can be observed for the average thickness of less than 10 nm and very remarkably so for the average thickness of less than 8 nm.

The semiconductor device in still another aspect of this invention is characterized by an electrically erasable and programmable nonvolatile semiconductor device, which includes at least a floating gate electrode and a control gate electrode, the floating gate electrode being made of an amorphous silicon film formed over a gate insulating film, the control gate electrode being formed over the floating gate electrode through an interlayer insulating film so that at least a part of the control gate electrode overlaps the floating gate electrode; and a method of forming this semiconductor device.

The semiconductor device in still another aspect of this invention is characterized by an electrically erasable and programmable nonvolatile semiconductor device, which includes at least a floating gate electrode and a control gate electrode, the floating gate electrode being made of a plurality of conductor or semiconductor films formed over a gate insulating film, the control gate electrode being formed over the floating gate electrode through an interlayer insulating film so that at least a part of the control gate electrode overlaps the floating gate electrode. Of the layers forming the floating gate electrode, a layer in contact with the gate insulating film is an amorphous or polycrystalline silicon film with an average thickness of less than 10 nm, more preferably less than 8 nm. The advantage of this invention can be observed for the average thickness of less than 10 nm and very significantly so for the average thickness of less than 8 nm.

The semiconductor device in a further aspect of this invention is characterized by an electrically erasable and programmable nonvolatile semiconductor device, which includes at least a floating gate electrode and a control gate electrode, the floating gate electrode being made of a plurality of conductor or semiconductor films formed over a gate insulating film, the control gate electrode being formed over the floating gate electrode through an interlayer insulating film so that at least a part of the control gate electrode overlaps the floating gate electrode. Of the layers forming the floating gate electrode, a layer in contact with the gate insulating film is an amorphous silicon film.

The amorphous or polycrystalline silicon mentioned above means polycrystalline silicon or amorphous silicon, or a combination (e.g., mixture) of these. Based on the conventional manufacturing processes and methods in the field of semiconductor devices, polycrystalline silicon is easiest to handle.

Of the two or more layers of conductor or semiconductor material that form the floating gate electrode, layers other than the one that contacts the gate insulating film may use a material of the floating gate employed in ordinary semiconductor memory devices. For example, the semiconductor material includes silicon and the conductor material includes polycrystalline silicon, tungsten, or titanium nitride, all containing a high concentration of impurity.

In the floating gate electrode, silicon films overlying the bottom layer in contact with the gate insulating film often use polycrystalline silicon films containing phosphorus (P) or arsenic (As).

The bottom layer of the floating gate electrode in contact with the gate insulating film preferably has a thickness of less than 8 nm when it is formed of polycrystalline silicon. It is further preferred that the average grain size of the polycrystalline silicon be set lower than 20 nm. When amorphous silicon is used, the thickness range should preferably be lower than 8 nm. The overall thickness of the floating gate electrode can be set to an ordinary thickness for a floating gate electrode of a nonvolatile semiconductor memory device.

According to various aspects of the present invention, it is desired to have amorphous silicon or small-grained polycrystalline silicon at the interface with the gate insulating film (e.g., where this silicon forms a floating gate, amorphous silicon at the interface with the tunnel insulating film); and to have, e.g., large-grained polycrystalline silicon at the interface with an interlayer insulating film, to provide a smooth surface on which the interlayer insulating film is formed. The present invention achieves this goal by at least a two-layer electrode (e.g., floating gate electrode). Where the lower layer (adjacent the gate insulating film) is of polycrystalline silicon, the lower layer is thin and is small-grained (generally, the grain size is 2½ times the thickness of the layer; where the layer has a thickness of about 2 nm, the grain size would be about 5 nm); the upper layer is thick and is large-grained. Moreover in forming this electrode, a thin insulating film is provided between the lower and upper layers, so as to form the layers with different grain structure.

The semiconductor device in a further aspect of this invention is characterized by an electrically erasable and programmable nonvolatile semiconductor device, which includes at least a floating gate electrode formed over a gate insulating film and a control gate electrode formed over the floating gate electrode through an interlayer insulating film so that at least a part of the control gate electrode overlaps the floating gate electrode, wherein the floating gate electrode is made of two or more layers of conductor or semiconductor films processed by using the same mask, and wherein the thin film in contact with the gate insulating film is a silicon film with an average thickness of less than 10 nm, preferably less than 8 nm.

In this case, it is very desirable that the layer of the floating gate electrode in contact with the gate insulating film have a thickness of less than 8 nm when it is made of polycrystalline silicon. It is further preferred that the average grain size of the polycrystalline silicon be set smaller than 20 nm. When the bottom layer of the floating gate electrode in contact with the gate insulating film is made of amorphous silicon, it should very preferably have a thickness of less than 8 nm.

The thickness of the floating gate electrode as a whole can be set to an ordinary thickness. In the floating gate electrode, silicon films overlying the bottom layer in contact with the gate insulating film would generally use polycrystalline silicon films containing phosphorus (P) or arsenic (As).

The present invention has been accomplished based on the following findings on the gate insulating film.

(1) The relation between the F-N current of an MOS capacitor and the thickness of a polycrystalline silicon film as a gate electrode was examined. The study found that the F-N current significantly increases when the thickness of this polycrystalline silicon film is smaller than about 8 nm.

(2) When the gate electrode in contact with the gate insulating film is made of an amorphous silicon film, too, an effect similar to (1) was produced.

These phenomena may be explained as follows. Insulating substances such as oxygen and nitrogen present in the surface of a polycrystalline silicon film, when subjected to a high temperature heat treatment, diffuse through boundary surfaces of silicon grains to reach the rear side of the polycrystalline silicon film (i.e., on the gate insulating film side). At this time, they react with the silicon film on the rear side to form a new insulating film. This phenomenon tends to occur along the fine grain boundaries, producing a fine, rough surface on the rear side of the polycrystalline silicon film. Therefore, when an electric field is applied, the field concentrates on fine projections, which in turn is considered to cause a significant increase in the F-N current.

Further, in the above aspect of this invention, when an amorphous silicon film and other gate materials are used, there is formed at a boundary with a conductor film or semiconductor film an insulating thin film that includes an amorphous silicon film in contact with the gate insulating layer and other gate materials. This insulating thin layer is mostly a silicon oxide film, a silicon nitride film, or a combination of these. The thickness of this insulating thin film ranges between 0.3 nm and 1 nm. Of these insulating films, a thermally oxidized layer is most useful.

Amorphous silicon films formed by chemical vapor deposition are generally recognized to crystallize at temperatures higher than 600–650° C. We have found, however, that the crystallization temperature of an amorphous silicon film became high where the amorphous silicon film has a film thickness 10 nm or less. However, this phenomenon is only observed when there is an insulating film about 0.3 nm or more on the surface of the amorphous silicon film.

FIG. 29 shows a relationship between thickness of an amorphous silicon film and a crystallization temperature thereof when the amorphous silicon film is formed by using disilane ($Si_2H_6$) at 450° C., 30 min. in the nitrogen atmosphere.

As shown in FIG. 29, it can be understood that the crystallization temperature of an amorphous silicon film suddenly rises, when it becomes thinner than about 10 nm. For example, when the film thickness of an amorphous silicon film is 5 nm, even if it is heat treated at about 750° C., crystallization does not occur. That is, a film thickness and a process temperature are controlled such that crystallization of the amorphous silicon film does not occur.

Accordingly, it is possible to form an optimum field effect transistor having an amorphous silicon gate electrode in case of consideration of this point of view.

DETAILED DESCRIPTION OF THE INVENTION

Various aspects of the present invention will be described in the following, in describing specific embodiments of the present invention. These specific embodiments are illustrative of these aspects and not to be limiting thereof, the full scope of the present invention being defined in the appended claims.

In the descriptions herein, where the method is described as comprising or including specific steps, and where the apparatus is described as including or comprising specific components, it is contemplated by the inventors that the method also consists essentially of, or consists of, the specific steps, and that the device also consists essentially of, or consists of, the specific components.

Embodiment 1

First, a comparative experiment using a capacitor, for explaining the present invention, will be described.

Figure 1:
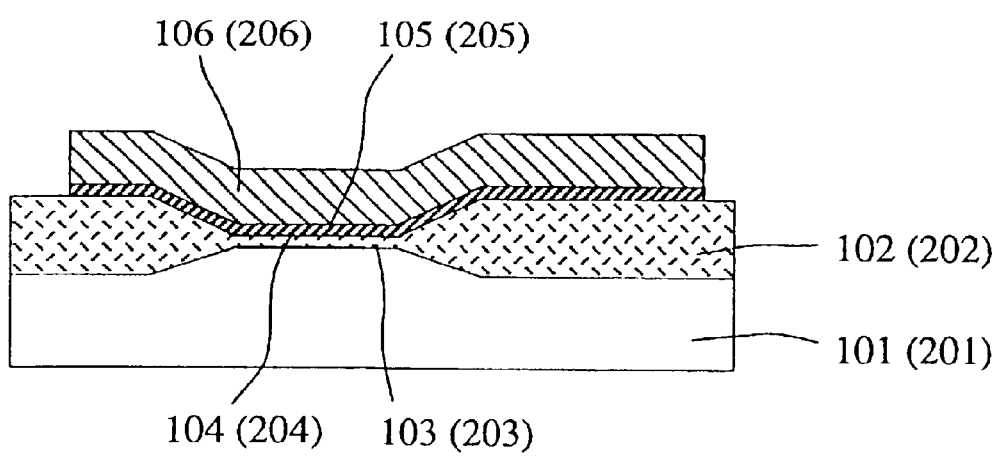
FIG. 1 is a cross section of a planar capacitor used to illustrate a basic feature of this invention.
Figures 2, 3:
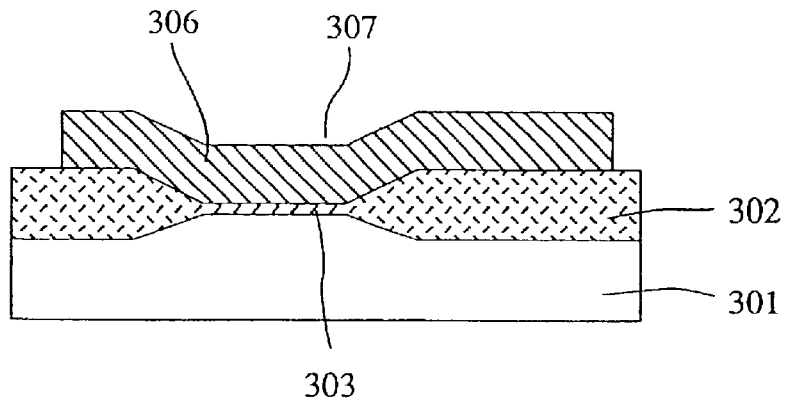
FIG. 2 is a cross section of a proposed planar capacitor for comparison with this invention.
FIG. 3 is a table showing conditions for each specimen to explain a basic feature of this invention.

Three kinds of planar capacitor structure were prepared to compare characteristics among them, such as current-voltage characteristic (I-V characteristic) of an MOS capacitor. Cross sections of these capacitors are shown in FIG. 1 and FIG. 2. FIG. 1 shows a structure corresponding to this invention. In the figures, reference numbers in the 100–200 range not including 200 represent the case where the underlying gate silicon film is a polycrystalline silicon film and those in the 200–300 range not including 300 represent the case where the underlying gate silicon film is an amorphous silicon film. Both cases have the same geometrical shapes. FIG. 2 is a cross section of a proposed (comparative) capacitor structure not within the present invention. FIG. 3 shows different processing conditions for the specimens.

First, device isolation oxide films 102, 202, 302 are formed over p-type single crystal silicon substrates 101, 201, 301 to a thickness of 500 nm by the known LOCOS method. Next, a gate insulating film is formed to a thickness of 7.7 nm by the pyrogenic oxidation method at 850° C. FIG. 1 and FIG. 2 show this gate oxide film as being represented by 103, 203, 303. The specimens used in this comparative experiment are shown in FIG. 3.

No. 1 and No. 6 specimens use gate electrodes outside of the present invention.

The gate electrode in these No. 1 and No. 6 specimens is initially formed as a phosphorus-doped amorphous silicon film (from which film 306 is formed) with a thickness of 200 nm. The phosphorus-doped amorphous silicon film is formed by the low pressure chemical vapor deposition (LP-CVD method) using $Si_2H_6$ and phosphine ($PH_3$). It is noted that phosphorus was doped in a high concentration of $3\times10^{20}$ atoms/cm$^3$ (FIG. 2).

Other specimens, No. 2 to No. 5 and No. 7, have an initial laminated structure including a non-doped amorphous silicon film, an $SiO_2$ film and a phosphorus-doped amorphous silicon film.

These films have the following thicknesses. The non-doped amorphous silicon films (from which films 104, 204 are formed) have a thickness of 2–8 nm, the initially formed $SiO_2$ films (location of which is shown by 105, 205) have a thickness of 0.5 nm and the phosphorus-doped amorphous silicon films (from which films 106, 206 are formed) have a thickness of 200 nm. These layers are formed successively and continuously in the same processing equipment. The process is detailed in the following.

First, by the LP-CVD method using $Si_2H_6$, the gate oxide films 103, 203 were deposited with non-doped amorphous silicon films. For the deposition a vertical LP-CVD equipment having a load lock mechanism was used. The deposition temperature was 420° C., the deposition pressure was 70 Pa and the flow rate of $Si_2H_6$ was set at 150 cc/min. Nitrogen was also supplied simultaneously as a carrier gas. The flow rate of nitrogen was 2000 cc/min.

The thickness of the amorphous silicon films is controlled by the time during which the $Si_2H_6$ gas is introduced. The amounts of amorphous silicon film introduced in the specimens are as follows. No. 2 specimen formed the amorphous silicon film to a thickness of 2 nm, No. 3 a thickness of 4 nm, No. 4 a thickness of 6 nm, No. 5 a thickness of 8 nm and No. 7 a thickness of 4 nm (see FIG. 3). The $Si_2H_6$ gas was stopped and the reaction furnace was evacuated, after which oxygen gas was supplied into the furnace to form $SiO_2$ films over the amorphous silicon films under a low-pressure oxygen atmosphere. The thickness of the $SiO_2$ films can be controlled by the oxygen pressure and the deposition time. In this embodiment, the thickness of the initially formed $SiO_2$ films at 105, 205 was set to 0.5 nm. After this, in the presence of low-pressure nitrogen the furnace temperature was raised to 525° C. and the amorphous silicon films, containing $3\times10^{20}$ atoms/cm$^3$ of phosphorus, were deposited to a thickness of 200 nm. In this specimen, too, formation of the phosphorus-doped amorphous silicon films used $Si_2H_6$ and $PH_3$, and their deposition was performed under the same condition as the previously described phosphorus-doped amorphous film which forms film 306.

In this experiment, we studied the method of forming the non-doped amorphous silicon films which form films 104, 204 and found that deposition at temperatures higher than about 480° C. results in an increase in the surface roughness of the thin-film surface, making it impossible to produce a planar continuous film. Further, this process increases the deposition rate, which in turn renders the control of film thickness very difficult. It is therefore desired that the non-doped amorphous silicon films which form films 104, 204 be formed at temperatures below 480° C.

Next, all specimens were nitrogen-annealed for 40 minutes, at 750° C., in order to achieve activation of the phosphorus-doped silicon films which form films 106, 206, 306. The phosphorus-doped amorphous silicon films which form films 106, 206, 306 of all specimens were converted into phosphorus-doped polycrystalline silicon films. At this heat treatment temperature only the phosphorus-doped silicon films which form films 106, 206, 306, with a 200-nm thickness, crystallize. During this process the non-doped amorphous silicon films which form films 104, 204, in contact with the gate insulating films 103, 203, remain in their amorphous state. This is because the conversion of silicon into the polycrystalline structure is promoted by phosphorus. Crystallization of the amorphous silicon occurs when the radius of silicon clusters reaches a certain magnitude. This cluster radius is generally called a critical radius. The thickness of the silicon film in this invention is equal to or greater than the critical radius, so that crystallization does not normally occur unless a heat treatment is conducted at a temperature higher than that of the heat treatment where the amorphous silicon crystallizes.

Further, the specimen No. 1, No. 2, No. 3, No. 4 and No. 5 were additionally heat-treated for 120 minutes at 900° C. in a nitrogen atmosphere. This converted the non-doped amorphous silicon film which forms film 104, corresponding to the underlying electrode of the MOS capacitor of this comparative experiment, into a polycrystalline silicon film.

The phosphorus-doped polycrystalline silicon films and the underlying silicon films were processed into a predetermined shape to form gate electrodes 104, 106, 204, 206, 306. Now, MOS capacitors shown in FIGS. 1 and 2 are formed.

First, a transmission electron microscope was used to observe the crystal state and grain size of the silicon films 104, 106, 204, 206, 306 which are the gate electrodes. The crystal grain size of the overlying electrodes 106, 206, 306 of the specimens (No. 1 to No. 5), which were additionally heat-treated at 900° C. for 120 minutes, was invariably about 0.5 μm to 1.5 μm. On the other hand, it is found that the very thin silicon film 104 shown in FIG. 1 was a polycrystalline silicon film 104 with a very small grain size. Their average grain size were about 2–2.5 times the deposited film thickness. The No. 5 specimen having an 8-nm thickness of the underlying silicon film 104 has the average grain size of about 20 nm.

As for the No. 6 and No. 7 specimens that were not subjected to high-temperature heat treatment, i.e., the specimens that have undergone only the heat treatment at 750° C., the grain sizes of the phosphorus-doped polycrystalline silicon films 206, 306 were in the range of about 0.3 μm to 1.0 μm. As to the No. 7 specimen, it was found that the underlying silicon film 204 is an amorphous silicon film 204 retaining the crystal structure formed immediately after deposition and that the thin $SiO_2$ film 205 (about 0.5 nm thick) over the silicon film 204 remains unchanged.

Figure 4:
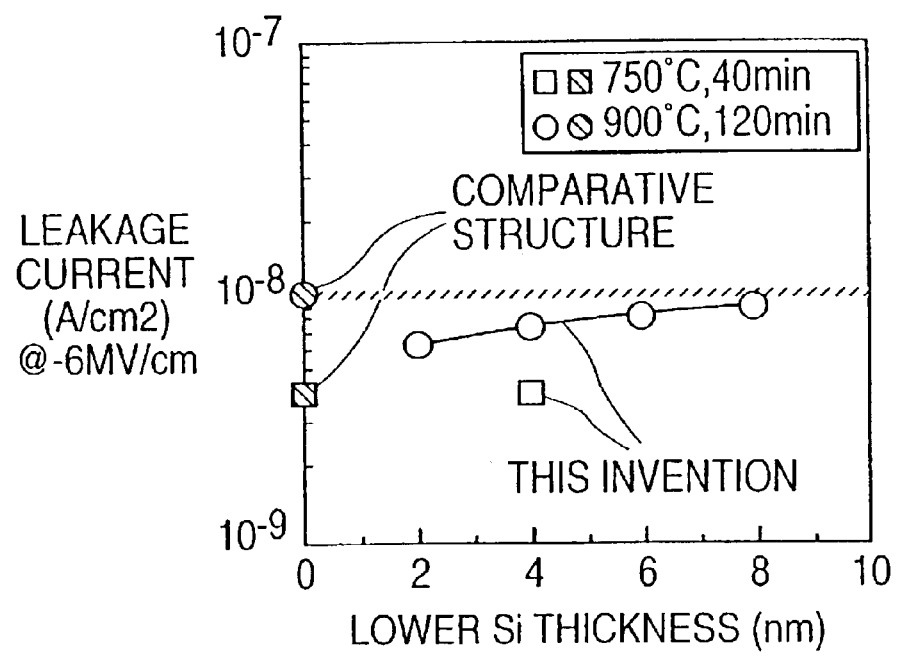
FIG. 4 is a diagram showing a comparison of the leakage current densities at a low electric field after application of constant current stresses.
Figure 5:
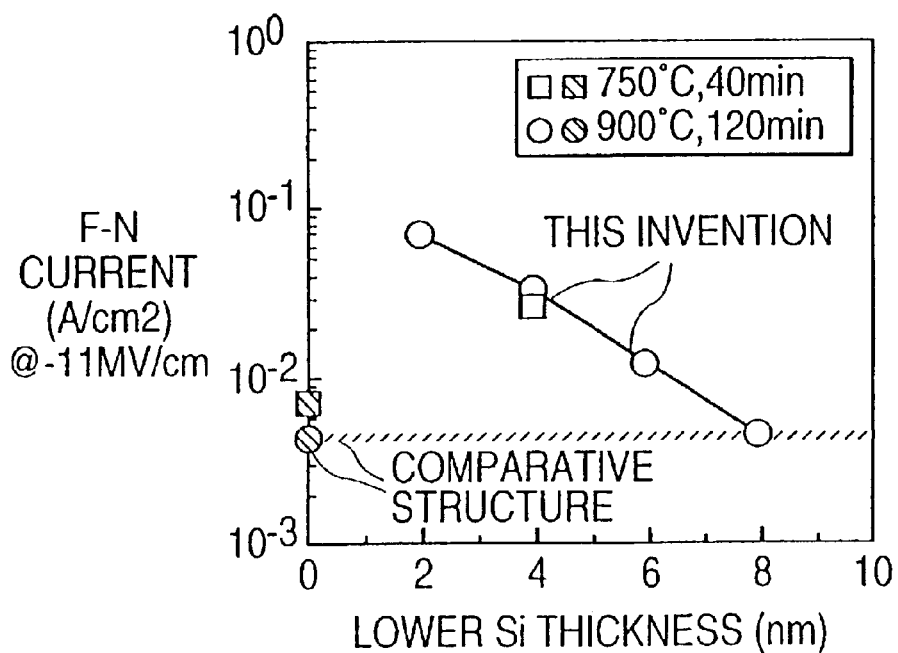
FIG. 5 is a diagram showing comparison of the write/erase (F-N) currents after application of constant current stresses.

For each of the specimens, comparison was made between the current-electric field characteristics before and after the application of constant current stresses. FIG. 4 shows the relation between the thickness of the underlying ultrathin silicon films 104, 204 deposited over the gate oxide film 103 and the low electric field leakage current (for −6 MV/cm). FIG. 5 shows the relation between the thickness of the underlying ultrathin films 104, 204 deposited over the gate oxide film 103 and the F-N current (−11 MV/cm) for those specimens that are shown in FIG. 4. In this figure, the point at 0 nm of the underlying silicon film corresponds to the single layer gate electrode 306.

This figure shows that this invention can increase the F-N current substantially while maintaining the low electric field leakage current after stress application at a level at least equal to the leakage current of the comparative structure outside the present invention. That is, the F-N current increases with the decrease in the thickness of the underlying silicon film 104, beginning with a region where the thickness of the underlying silicon film 104 becomes thinner than 8 nm. For the specimen in which the underlying silicon film 104 is 2 nm thick, in particular, the F-N current has increased by about one order of magnitude over the specimens of the comparative structure.

Figure 6:
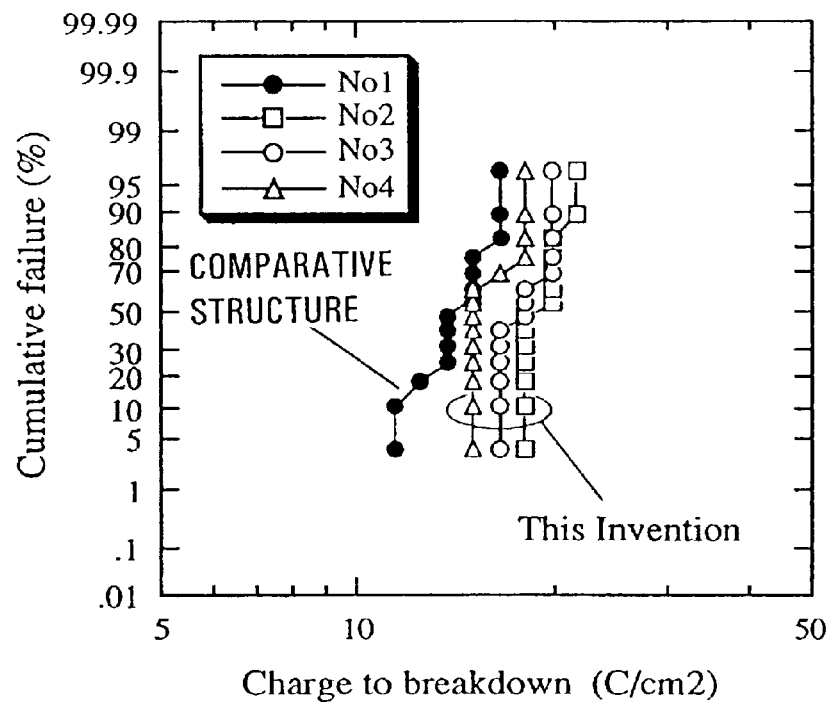
FIG. 6 is a diagram showing comparison of the destruction electric charge distribution under constant current stresses (for capacitors subjected to heat treatment at 900° C.).

FIG. 6 shows a comparison of a destruction electric charge distribution under constant current stresses for the specimens that have undergone an additional heat treatment at 900° C. for 120 minutes. In FIG. 6, the ordinate represents a cumulative failure and the abscissa represents a destruction electric charge quantity.

According to this invention, it is understood that the destruction electric charge quantity under the constant current stresses is improved over the aforementioned comparative structure, as the underlying silicon film 104 becomes thin. With this invention it is seen that the amount of charge to breakdown, under the constant current stresses, is improved over the aforementioned proposed structure as the underlying silicon film 104, 204 becomes thin.

When the underlying amorphous silicon film was heat-treated and converted into a polycrystalline silicon film 104 before the overlying electrode 106 was deposited, the similar result to that described above was also obtained.

Figure 7:
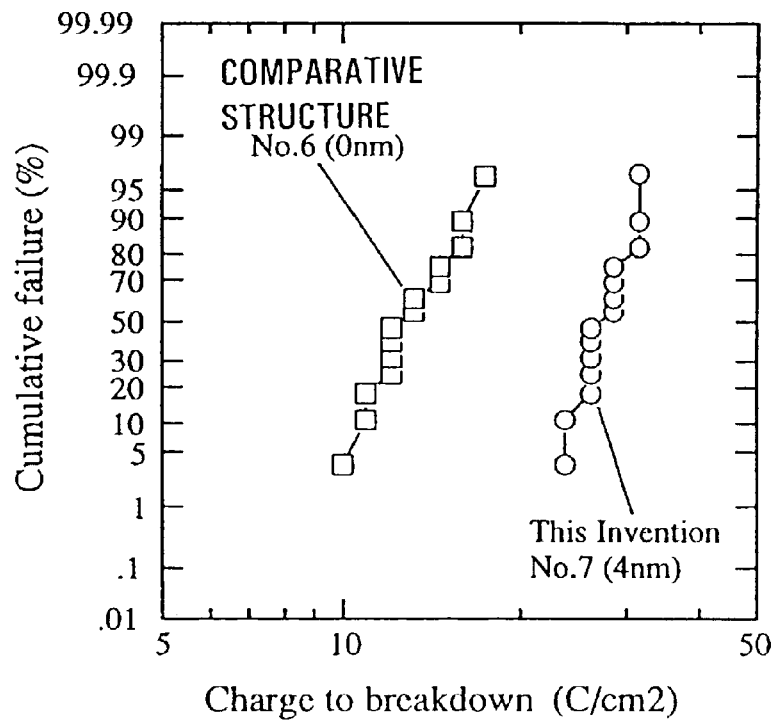
FIG. 7 is a diagram showing comparison of the destruction electric charge distribution under constant current stresses (for capacitors subjected to heat treatment at 750° C.).

FIG. 7 shows a comparison of a destruction electric charge distribution under the constant current stresses for the No. 6 and No. 7 specimens that were subjected only to the heat treatment at 750° C. for 40 minutes. This invention is shown to improve the destruction electric charge quantity by about two times over the aforementioned comparative structure.

In this embodiment, although the result is shown only for the specimen having the thickness of the underlying amorphous silicon film 204 of 4 nm, the identical results with those of the above specimens were obtained up to about 8 nm in the thickness of the underlying amorphous silicon film.

Examination of the relation between the heat treatment temperature after the non-doped amorphous silicon film is formed and the crystal structure of that film has found that when the film thickness becomes larger than about 8 nm, the crystallization temperature of the amorphous silicon film decreases. Hence, to keep the film amorphous up to about 800° C., it is desired that the thickness of the amorphous silicon film be less than about 8 nm.

Further, in this embodiment, while the $SiO_2$ films 103, 203 formed by oxidizing the silicon substrate in the presence of water vapor were used for the gate insulating films 103, 203, a similar effect was also obtained when an oxynitride film formed in the following atmospheres is used. These atmospheres are (1) ammonia ($NH_3$) atmosphere, (2) a dinitrogen oxide ($N_2O$) atmosphere, or (3) a nitrogen monoxide (NO) atmosphere. Here, the overlying electrodes 106, 206 were formed by depositing in-situ amorphous silicon films. The similar effect was also produced when an in-situ polycrystalline silicon film was deposited.

Another important feature of this invention is the thickness of insulating films 105, 205 that are present at the boundary between the underlying ultrathin silicon films 104, 204 and the overlying electrodes 106, 206. In this embodiment, after the ultrathin underlying silicon films 104, 204 were deposited, they were oxidized in the same CVD equipment to form $SiO_2$ films 105, 205 to a thickness of about 0.5 nm. Examination on the thickness of the $SiO_2$ films 105, 205 over the surfaces of the ultrathin silicon films 104, 204 has found that when the $SiO_2$ film thickness becomes smaller than about 0.3 nm, the crystallization to form the overlying electrodes 106, 206 causes the underlying ultrathin silicon films to crystallize simultaneously with and in alignment with the crystal structure of the overlying layer, making these layers almost identical with a single-layer film.

When, on the other hand, the thickness of the $SiO_2$ 105, 205 becomes larger than about 1 nm, the insulating films 105, 205 work as resistors causing the gate voltage to fall. That is, in this invention, it is highly desired to set the thickness of the insulating films 105, 205 present at the electrode boundary in the range between about 0.3 nm and 1 nm. As to the insulating film at the boundary, the similar result was also obtained when a nitride film and an oxynitride film formed in atmospheres containing nitrogen atoms were used.

Embodiment 2

Next, a second embodiment of this invention will be described by referring to the drawings.

Figure 8:
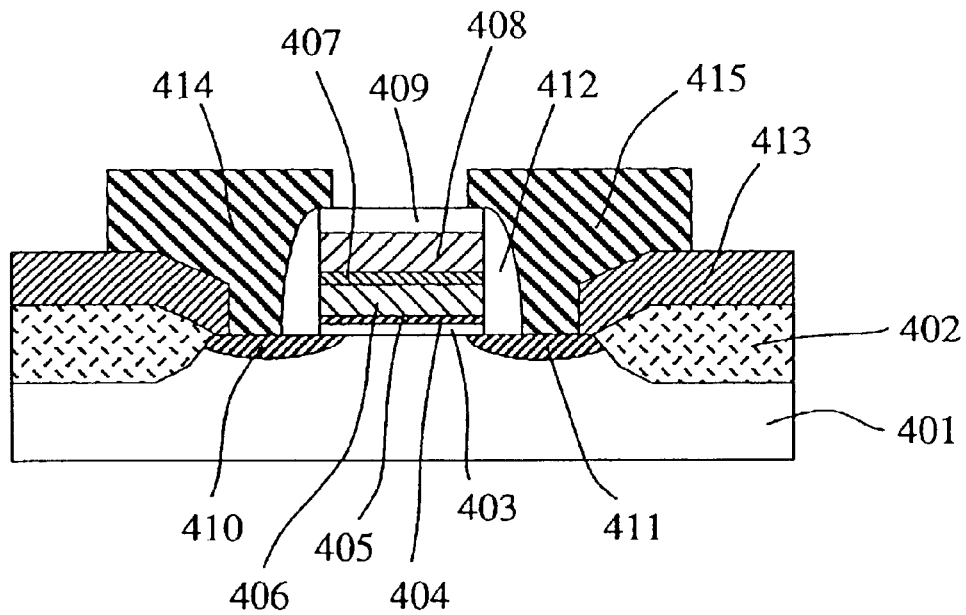
FIG. 8 is a cross section of a first memory cell used in a second embodiment of this invention.
Figure 9:
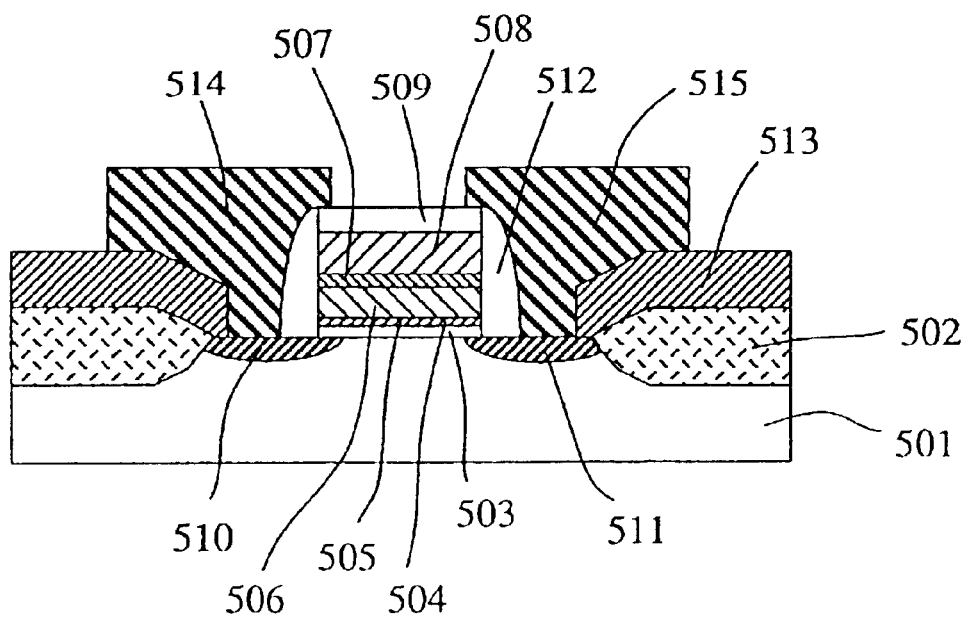
FIG. 9 is a cross section of a second memory cell used in the second embodiment of this invention.
Figure 10:
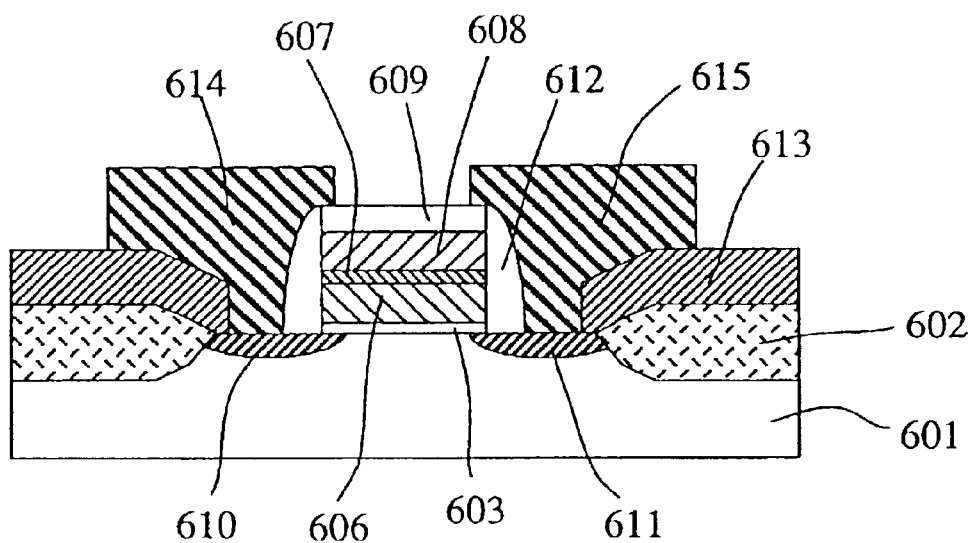
FIG. 10 is a cross section of a proposed memory cell used for comparison with the second embodiment of this invention.

In this embodiment memory cells shown in FIG. 8 to FIG. 10 were fabricated to evaluate the programming (write/erase) time. The specimens of FIGS. 8 and 9 use the thickness of very thin silicon films (or ultrathin silicon films) 404, 504 as a parameter as mentioned earlier. The specimen of FIG. 8 is one whose non-doped ultrathin silicon film 404 in contact with the gate oxide film 403 was converted into a polycrystalline silicon film 404 by heat treatment at 900° C. The specimen of FIG. 9 has the maximum process temperature of 750° C. Now, by referring to FIG. 8 to FIG. 10, detailed description will be given.

First, device isolation oxide films 402, 502, 602 were formed over p-type single crystal silicon substrates 401, 501, 601 by the known LOCOS method. In regions enclosed by the device isolation oxide films, gate insulating films 403, 503, 603 were formed to a thickness of 8 nm by the pyrogenic oxidation method at 850° C. Next, a proposed (comparative) specimen (FIG. 10) as a control specimen was made by depositing a polycrystalline silicon film, to form film 606, containing $3 \times 10^{20}$ atoms/cm$^3$ of phosphorus to a thickness of 100 nm by the LP-CVD method. In this embodiment of the invention, amorphous non-doped ultrathin silicon films, to form films 404, 504, were each deposited to a thickness of 2 nm, 4 nm, 6 nm, 8 nm and 10 nm by the method of Embodiment 1, after which 0.5-nm $SiO_2$ films, to form films 405, 505, and 100-nm in-situ phosphorus-doped polycrystalline films, to form films 406, 506 were formed. In this embodiment, the above in-situ phosphorus-doped polycrystalline films, to form films 406, 506 were deposited at 630° C. using monosilane ($SiH_4$) and phosphine ($PH_3$).

Next, after the specimens were subjected to 30 minutes of heat treatment at 700° C. in a nitrogen atmosphere, the phosphorus-doped polycrystalline silicon films to form films 406, 506, 606 and the underlying ultrathin silicon films to form films 404, 504—both of which will form the floating gates 404, 406, 504, 506, 606—were processed at one side (parallel to the plane of paper of the figure) to a predetermined shape. This processing is done by known lithography and dry etching.

Next, inter-layer insulating films 407, 507, 607 made of a $SiO_2/Si_3N_4/SiO_2$ laminated film were formed by the LP-CVD method. The $SiO_2$ layers overlying and underlying the $Si_3N_4$ layer have a thickness of 4 nm and were formed using $SiH_4$ and dinitrogen oxide ($N_2O$) at the fabrication temperature of 700° C. The $Si_3N_4$ film has a thickness of 8 nm. It was formed by using (dichlorosilane) ($SiH_2Cl_2$) and ammonia ($NH_3$) at a manufacturing temperature of 700° C. This is followed by depositing 100-nm phosphorus-doped polycrystalline silicon films which will form control gate electrodes 408, 508, 608, and 100-nm $SiO_2$ films 409, 509, 609 by the LP-CVD method. These were then subjected to 20 minutes of heat treatment at 750° C. in a nitrogen atmosphere. Then, the above $SiO_2$ films 409, 509, 609, the phosphorus-doped polycrystalline silicon films which will form control gate electrodes 408, 508, 608, the inter-layer insulating films, and the films to form the floating gate electrodes 404, 406, 504, 506, 606 were processed on the other side (perpendicular to the plane of paper of the figure) to a predetermined shape to form the control gate electrodes 408, 508, 608 and the floating gate electrodes 404, 406, 504, 506, 606. The processing is done by known lithography and dry etching.

Next, after a $SiO_2$ film was deposited to a thickness of 10 nm by the LP-CVD method, phosphorus was ion-implanted in regions where sources 410, 510, 610 and drains 411, 511, 611 were to be formed. Then, the specimen of FIG. 8 and the proposed specimen of FIG. 10 were subjected to nitrogen annealing at 900° C. for 60 minutes, and the specimen shown in FIG. 9 was nitrogen-annealed at 700° C. for 300 minutes, to form the sources 410, 510, 610 and the drains 411, 511, 611.

Next, after 100-nm $SiO_2$ films were deposited by the LP-CVD method, they were etched over the entire surface by anisotropic dry etching to form sidewall insulating films 412, 512, 612 on the side walls of the floating gate electrodes 404, 406, 504, 506, 606, the ONO films 407, 507, 607, and the control gate electrodes 408, 508, 608. Then, $SiO_2$ films (phosphosilicate glass (PSG) films) 413, 513, 613 containing 4 mol % of phosphorus were deposited to a thickness of 300 nm by the atmospheric pressure CVD method and then contact holes were formed to expose the sources 410, 510, 610 and the drains 411, 511, 611.

Finally, aluminum layers were deposited to a thickness of 500 nm by the reactive sputtering method and then processed to a predetermined shape to form source interconnects 414, 514, 614 and drain interconnects 415, 515, 615, thus fabricating memory cells shown in FIGS. 8 to 10.

The specimen of FIG. 8 was subjected to the maximum process temperature of 900° C., so the ultrathin silicon film directly over the gate oxide film was transformed into a polycrystalline silicon film 404. On the other hand, the specimen of FIG. 9 was subjected to the maximum process temperature of 700° C. and the ultrathin silicon film 504 remained amorphous.

The write/erase characteristics were evaluated using nonvolatile semiconductor memory devices of the above structure. The erase operation was performed by injecting an electric charge into the floating gates 404, 406, 504, 506, 606 through the whole surface of the gate insulating films 403, 503, 603 by the F-N current. The write operation was done by pulling the electric charge out of the floating gate electrodes 404, 406, 504, 506, 606 to the drains 411, 511, 611 through the gate insulating films 403, 503, 603 by the F-N current. The process of erasure includes applying +10V to the control gate electrodes 408, 508, 608, opening the sources 410, 510, 610 and drains 411, 511, 611, and applying pulses of –4V to the silicon substrates 401, 501, 601 while checking the threshold voltage. The writing process includes applying –10V to the control gates 408, 508, 608, +4V to the drains 411, 511, 611, opening the sources 410, 510, 610, and applying pulses of 0V to the silicon substrates 401, 501, 601 while checking the threshold voltage.

Figure 11:
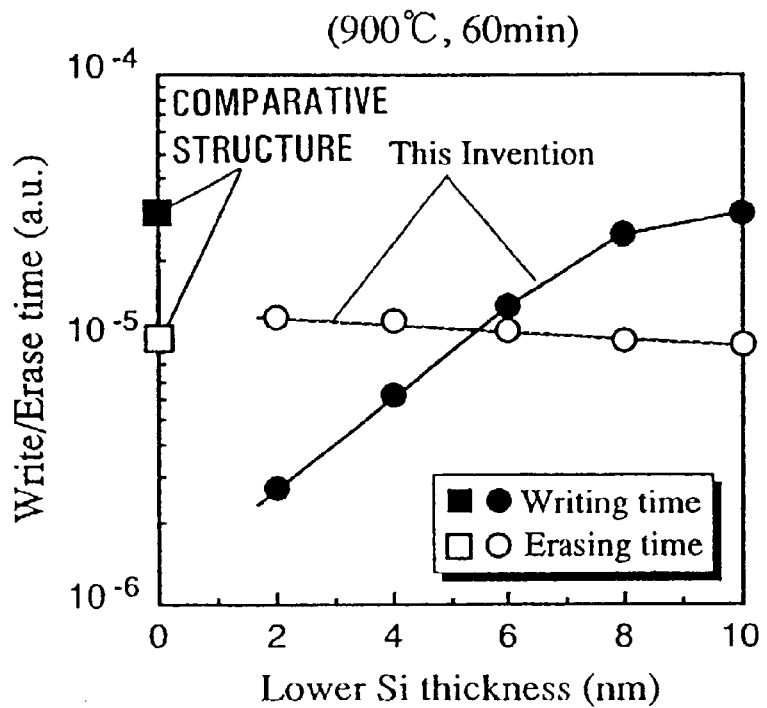
FIG. 11 is a diagram showing a comparison of write/erase times of the memory cells (subjected to heat treatment at 900° C.).

FIG. 11 shows the relation between the thickness of underlying ultrathin silicon film 404 of the above memory cells and the write/erase time. The specimens in FIG. 11 were heat-treated at 900° C. for 60 minutes. When compared with the memory cell manufactured by a comparative method, the memory cells of this invention showed almost no significant difference in the erase time. The write time, however, decreased substantially as the thickness of the underlying ultrathin silicon film 404 decreased.

Figure 12:
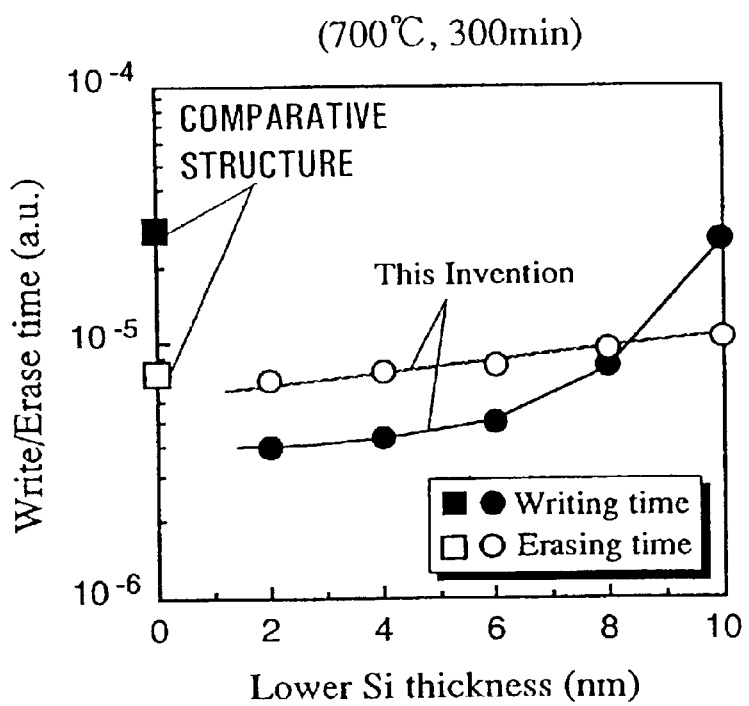
FIG. 12 is a diagram showing a comparison of write/erase times of the memory cells (subjected to heat treatment at 700° C.).

FIG. 12 shows a comparison of characteristics among specimens that were subjected to the maximum process temperature of 700° C. The write time of the specimens of this invention has substantially decreased from that of the specimens manufactured by a comparative method. The specimens of this invention exhibited a characteristic that the write time hardly changes up to the thickness of the underlying ultrathin silicon film 504 of about 6 nm and that the write time tends to become long once the thickness exceeds about 8 nm. This tendency corresponds to the fact, described in the first embodiment, that crystallization occurred at around the thickness of about 8 nm. Observation with the transmission electron microscope has shown that the underlying ultrathin silicon film 504 about 8 nm thick was locally crystallized and that the underlying ultrathin silicon film about 10 nm was converted into a polycrystalline silicon film almost entirely.

Although in this embodiment the floating gate electrode used a two-layer structure including a phosphorus-doped polycrystalline silicon film and a ultrathin silicon film, the similar effect was produced even when a three-layer structure such as a titanium nitride (TiN)/non-doped polycrystalline silicon/ultrathin silicon structure was employed. That is, it is found that an increase in the F-N current depends on the thickness of the lowermost silicon film in contact with the gate insulating film or on its grain size, not on the floating gate electrode material lying over the lowermost silicon film.

Embodiment 3

Next, a third embodiment of this invention will be explained. The two- and three-layer floating gate structures including an ultrathin silicon film as the lowermost layer have been described. Here we take up an example in which the floating gate electrode is formed of an ultrathin silicon single-layer film.

Figure 13:
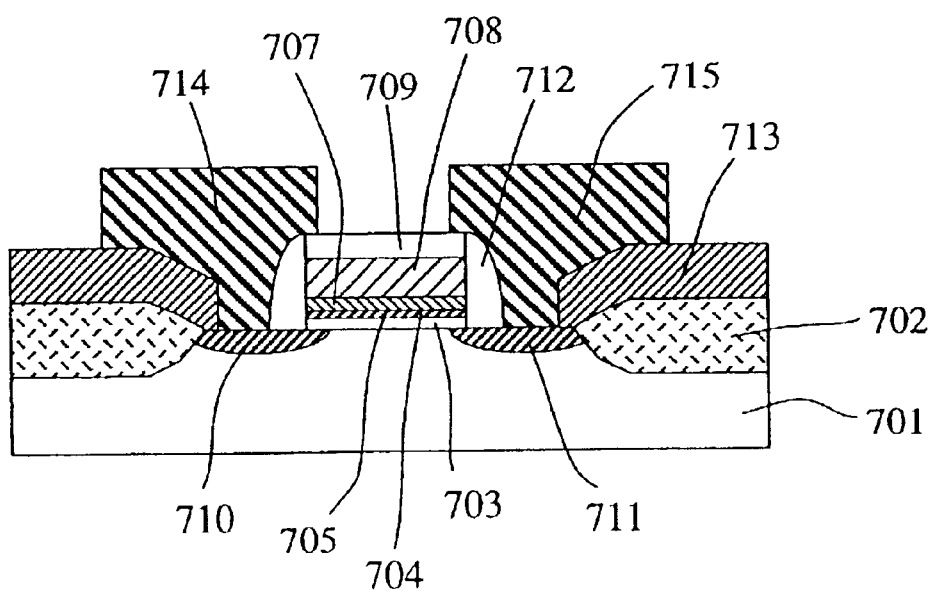
FIG. 13 is a cross section of a memory cell used in the third embodiment of this invention.

FIG. 13 shows a cross section of a nonvolatile semiconductor memory device manufactured in the third embodiment of this invention. The structure and process flow of this embodiment are almost identical to the proposed structure compared to the second embodiment, shown in FIG. 10. The only difference is the thickness of the floating gate electrode 704 and the method of its manufacture. As shown in FIG. 10, the floating gate electrode 606 is a polycrystalline silicon film 606 containing phosphorus, which is as thick as 50 nm or more. The floating gate electrode 704 is a non-doped silicon film 704 formed in a similar process to that of the underlying ultrathin silicon film 504 of the second embodiment, and is characterized by a very small thickness less than about 8 nm. In FIG. 13, 701 is a silicon substrate (e.g., p-type single crystal silicon), 702 device isolation oxide films, 703 gate insulation film, 704 silicon film forming a floating gate electrode, 707 inter-layer insulating film, 708 control gate electrode, 709 insulating film, 710 and 711 respectively source and drain regions, 712 sidewall insulating films, 713 phosphosilicate glass (PSG) film, and 714 and 715 source and drain interconnects respectively.

Figure 14:
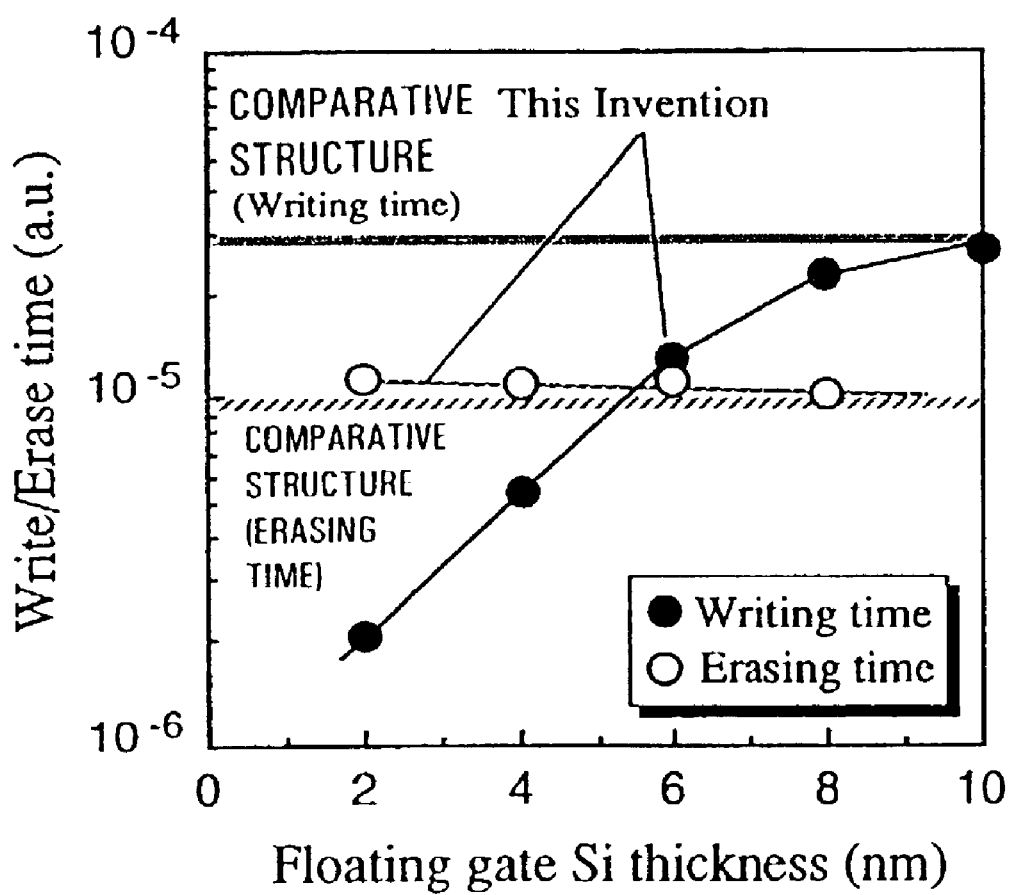
FIG. 14 is a diagram showing a comparison of write/erase times of the memory cells (subjected to heat treatment at 900° C.).
Figure 15:
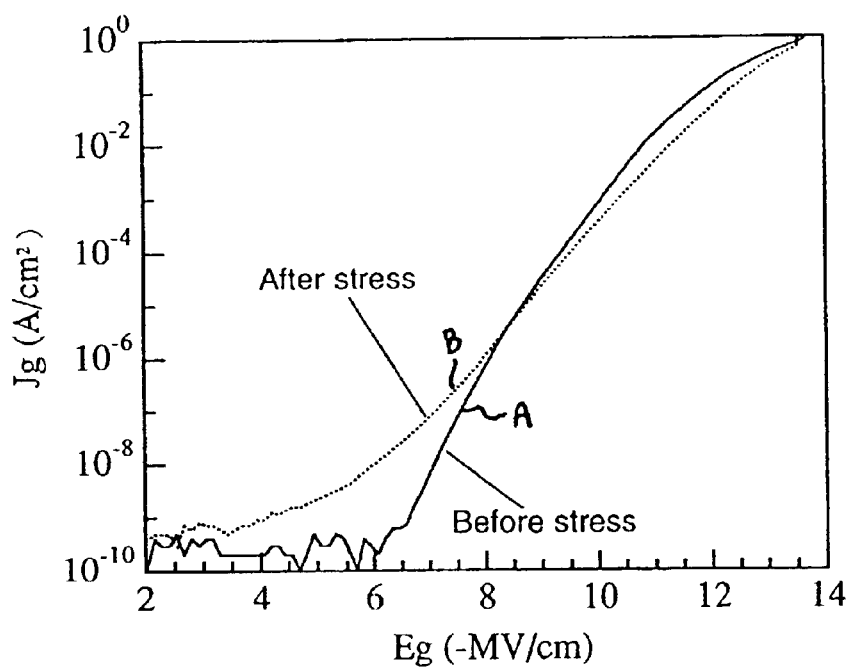
FIG. 15 is a diagram showing a comparison of the current-electric field characteristics before and after application of constant current stresses.
Figure 16:
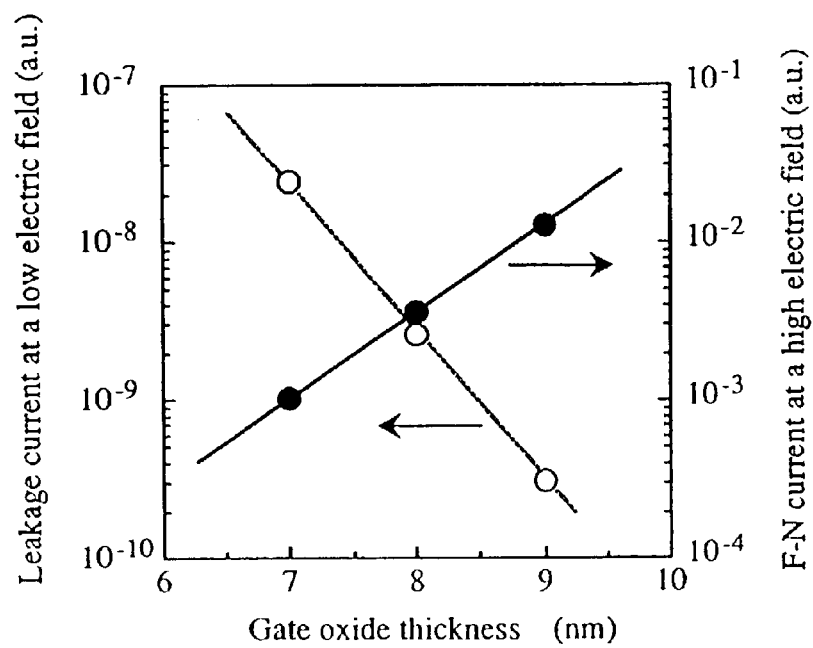
FIG. 16 is a diagram showing a general relation between the thickness of the gate insulating film and the current density.

FIG. 14 shows the write/erase time when the thickness of the floating gate electrode 704 is set in the range of between 2 nm and 10 nm. The method of evaluating the erase/write characteristics is the same as that used in the embodiment 3.

The erase time is nearly equal to that of the conventional method, while the write time significantly decreases as the thickness of the floating gate silicon 704 decreases, particularly when the thickness goes below about 8 nm.

In this embodiment the maximum process temperature is as high as 900° C., so that the floating gate electrode is a polycrystalline silicon film. When the memory cell is formed at a temperature below 700° C. as in the second embodiment, i.e., when the floating gate electrode is formed of a non-doped amorphous silicon film, the write time is also substantially reduced compared with that of structure formed by other methods.

Embodiment 4

Detailed description will be given to an example case where the present invention is applied to a semiconductor integrated circuit device having nonvolatile memory cells.

It is noted that parts having the identical functions are assigned like reference numerals throughout the drawings used to explain this embodiment. Repetitive explanations are not given.

Figure 17:
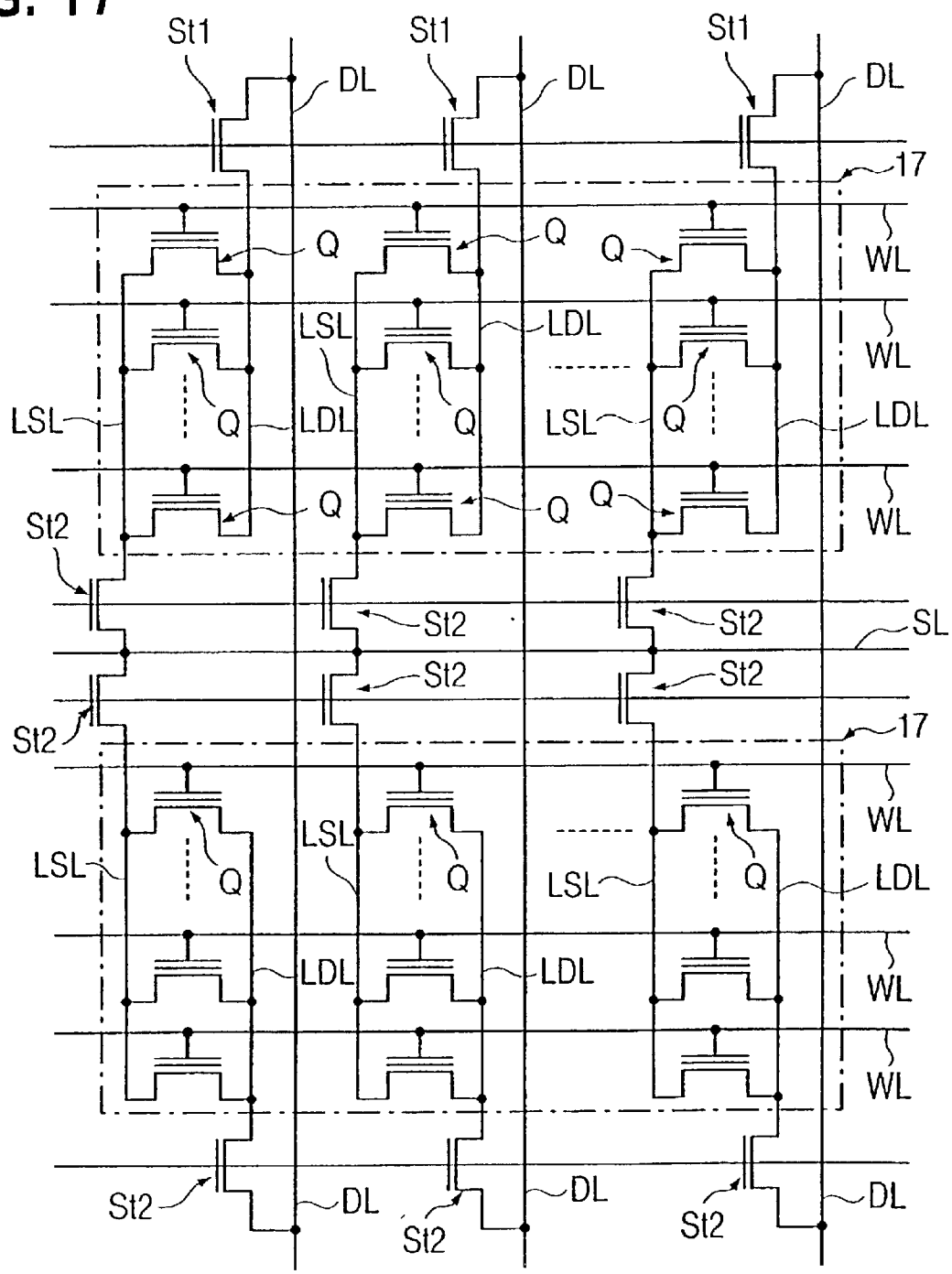
FIG. 17 is an equivalent circuit diagram showing a portion of a memory array of a semiconductor integrated circuit device as a fourth embodiment of this invention.

The outline configuration of the semiconductor integrated circuit device as the fourth embodiment of this invention is illustrated in FIG. 17 (an equivalent circuit of a part of the IC device).

As shown in FIG. 17, the semiconductor integrated circuit device mounts a memory cell array in which a plurality of memory blocks 17 are arranged in a matrix. The memory cell array has a plurality of word lines WL extending in an X direction and a plurality of data lines DL extending in a Y direction.

The memory block 17 has nonvolatile memory cells Q that perform the write operation and the erase operation by the tunneling effect. These nonvolatile memory cells Q are arranged at a plurality of locations along the word lines WL and also along the data lines DL. That is, the nonvolatile memory cells Q are arranged at intersections between the word lines WL and the data lines DL.

The application for which the detailed description in this specification is directly intended concerns the structure of the nonvolatile memory cells Q.

Each of the data lines DL is electrically connected, through selection transistors St1 and local data lines LDL, with drains of the nonvolatile memory cells Q arranged along the data line DL. Sources of the nonvolatile memory cells Q arranged along each data line DL are electrically connected with selection transistors St2 through local source lines LSL. The local source lines LSL are electrically connected to source lines SL through the selection transistors St2. Control gate electrodes of the nonvolatile memory cells Q arranged along each word line WL are electrically connected to the word line. The memory array constructed as described above allows the erase operation on the nonvolatile memory cells Q to be performed for each word line WL, for each memory block 17 or also for the entire memory array. The word lines WL and the control gate electrodes of the nonvolatile memory cells Q are generally formed integrally as described later.

Figure 18:
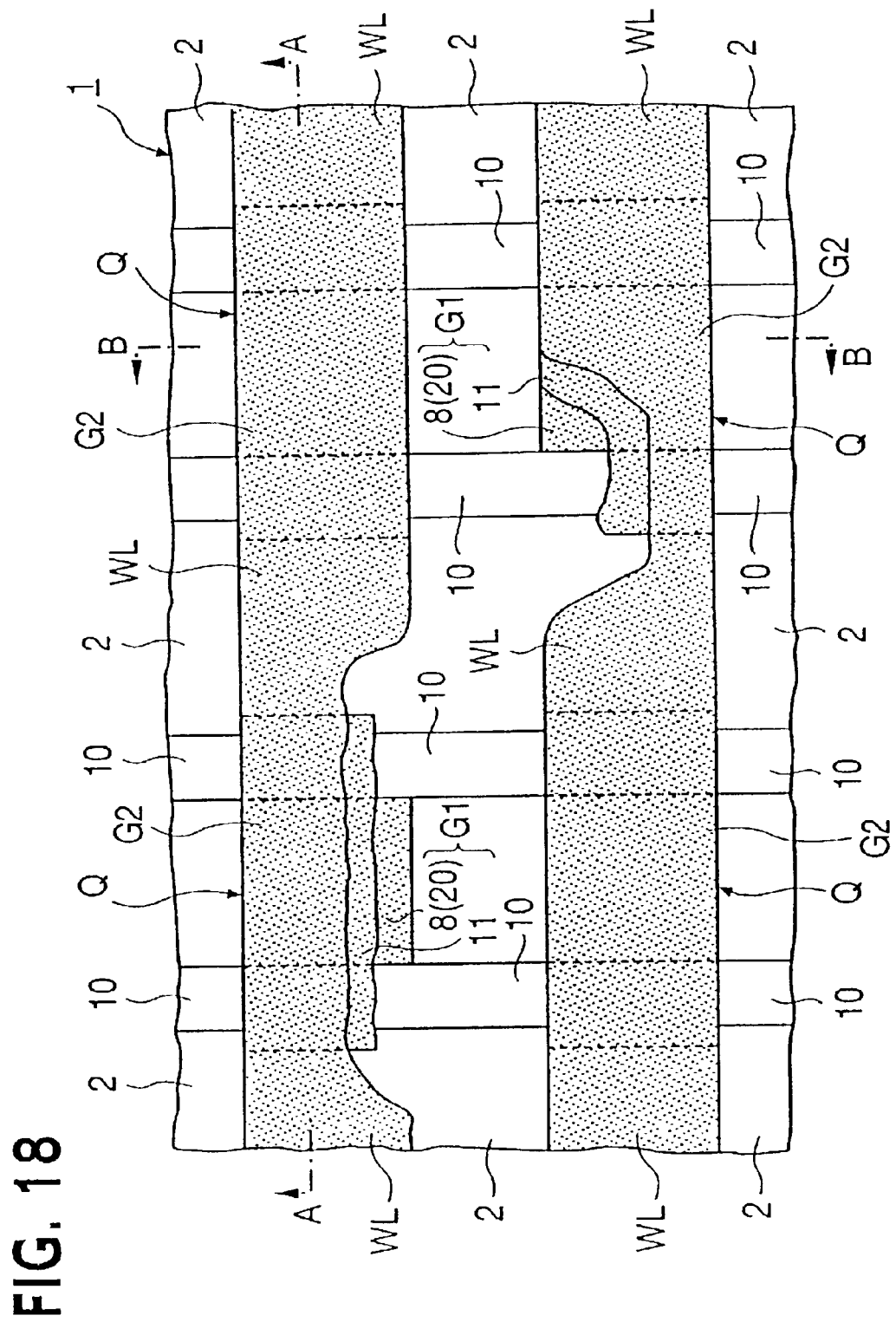
FIG. 18 is a plan view showing a portion of the semiconductor integrated circuit device of FIG. 17.

Next, the detailed structure of the nonvolatile memory cells Q of the semiconductor integrated circuit device will be explained by referring to FIG. 18 (plan view), FIG. 19 (cross section taken along the line A—A of FIG. 18) and FIG. 20 (cross section taken along the line B—B of FIG. 18). In FIG. 18 an interlayer insulating film 30 and data lines DL are not shown for simplicity.

The nonvolatile memory cells Q are, as shown in FIG. 18, arranged along the word lines WL extending in the direction of gate length (X direction) and also along the data lines (not shown) extending in the direction of gate width (Y direction).

Figure 19:
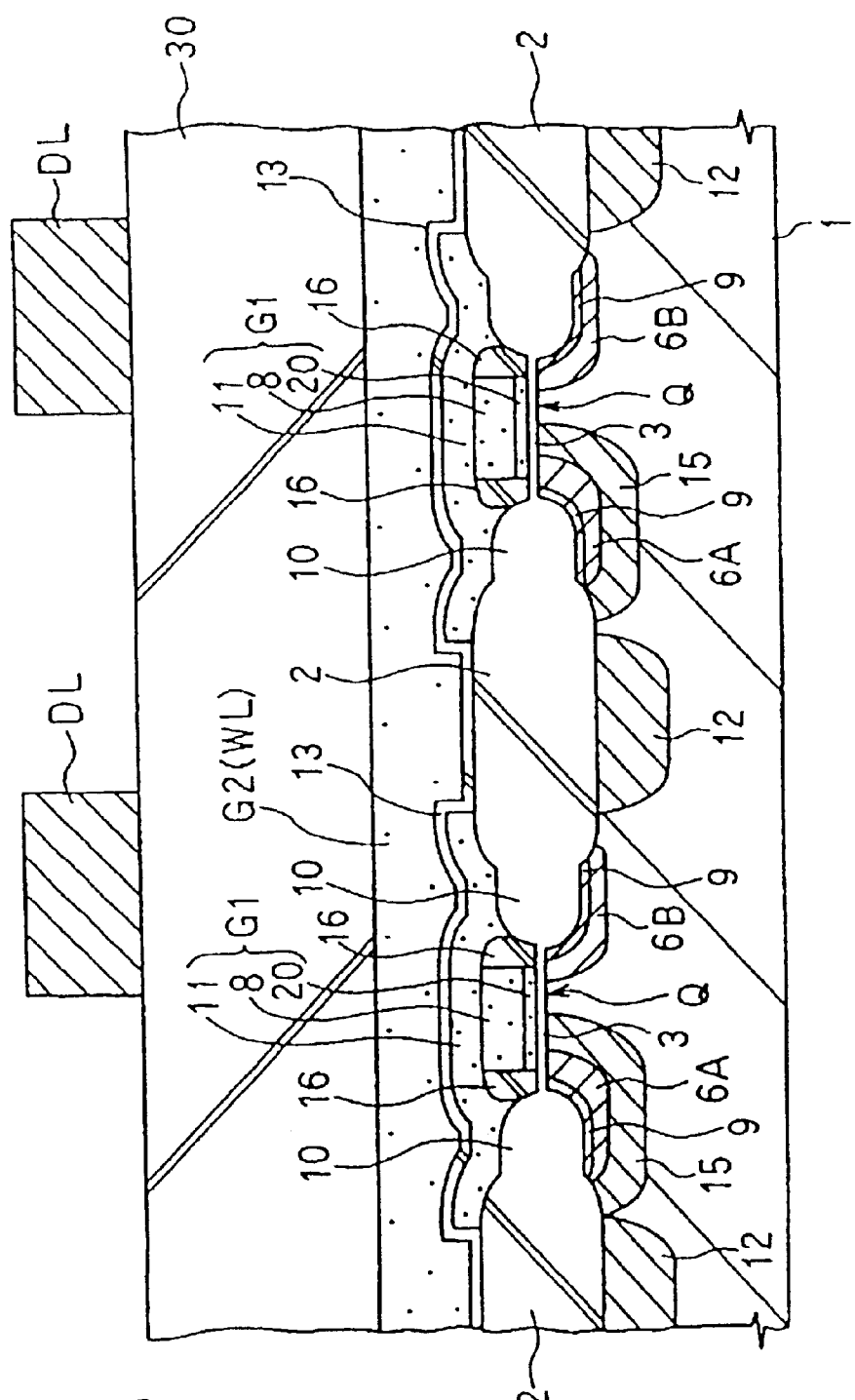
FIG. 19 is a cross section taken along the line A—A of FIG. 18.

As shown in FIG. 19, the nonvolatile memory cells Q are formed on the surface of active regions of a p-type semiconductor substrate 1 of a single crystal silicon. The nonvolatile memory cell Q comprises mainly a p-type semiconductor substrate 1 where channels are to be formed, a first gate insulating film 3, a floating gate electrode (also called a floating gate or a charge storage gate electrode) G1, a second gate insulating film 13, a control gate electrode G2, an n-type semiconductor region 6A that forms a source, an n-type semiconductor region 6B that forms a drain, a pair of n+type semiconductor regions 9 that form a source and a drain, and a p-type semiconductor region 15 that is a threshold voltage control region. The nonvolatile memory cell Q is therefore formed as an n-channel conduction type field-effect transistor.

The first gate insulating film 3 is made of a silicon oxide film with a thickness of around 8 nm. The second gate insulating film 13 has a multilayer structure including, for example, a first silicon oxide film, a silicon nitride film and a second silicon oxide film stacked together. The first silicon oxide film may be set to a thickness of about 5 nm, the silicon nitride film to a thickness of about 10 nm, and the second silicon oxide film to about 4 nm.

The floating gate electrode G1 of this invention has a first gate material (8, 20) and a second gate material 11 stacked on the surface of the first gate material (8, 20). In this embodiment, the first gate material includes an amorphous silicon or polycrystalline silicon film 20 and a polycrystalline silicon film 8. The underlying layer 20 of the first gate materials is, for example, a polycrystalline silicon film 20, which is formed by depositing an amorphous silicon film and heat-treating it for crystallization and has an average thickness of less than 8 nm. These two layers form the first gate material.

The second gate material 11 is formed of a polycrystalline silicon film doped with an impurity (for example, phosphorus) to reduce resistance. This polycrystalline silicon film is set to a film thickness of, say, about 100 nm and an impurity concentration of about $3.5 \times 10^{20}$ atoms/cm$^3$. The impurity introduced into the polycrystalline silicon film is introduced during or after the deposition of the polycrystalline silicon film. The first gate material (8, 20) is first formed of a polycrystalline silicon film not containing any impurity with a thickness of about 50 nm. Then, the impurity concentration is set to about $2.5 \times 10^{20}$ atoms/cm$^3$. The impurity introduced into the first gate material (8, 20) is introduced by thermal diffusion (drive-in diffusion) from the polycrystalline silicon film of the second gate material 11.

The width of the first gate material (8, 20) in the direction of the gate length defines the gate length of the floating gate electrode G1. The width of the first gate material (8, 20) in the gate length direction is set to, for example, about 0.5 μm. In other words, the gate length of the floating gate electrode G1 is set to 0.5 μm.

On sidewalls of the first gate material (8, 20) in the gate length direction are formed sidewall spacers 16, which may be a silicon oxide film formed by a CVD method.

The control gate electrode G2 is formed of a polycrystalline silicon film doped with an impurity (for example, phosphorus) to reduce its resistance. The polycrystalline silicon film may be set to a film thickness of about 200 nm and to an impurity concentration of about $3.5 \times 10^{20}$ atoms/cm$^3$.

The n-type semiconductor region 6A that constitutes the source is formed on the surface of an active region of the p-type semiconductor substrate 1 between the thermally oxidized insulating film (field insulating film) 2 and the first gate material (8, 20) and is set to an impurity concentration of, say, about $5 \times 10^{19}$ atoms/cm$^3$. The n-type semiconductor region 6B that constitutes the drain is formed on the surface of an active region of the p-type semiconductor substrate 1 between the thermally oxidized insulating film 2 and the first gate material (8, 20) and is set to an impurity concentration of, say, about $5\times10^{20}$ atoms/cm$^3$. The pair of n$^+$-type semiconductor regions 9 that constitute the source and drain is formed on the surfaces of the n-type semiconductor region 6A and the n-type semiconductor region 6B and is set to an impurity concentration of, say, about $7\times10^{20}$ atoms/cm$^3$. That is, the paired n$^+$-type semiconductor regions 9 are each set to an impurity concentration higher than that of the n-type semiconductor region 6A and n-type semiconductor region 6B. The nonvolatile memory cells Q are therefore formed in a lightly doped drain (LDD) structure in which a part of the drain on the channel formation region side has a lower impurity concentration than other regions.

The p-type semiconductor region 15, which constitutes the threshold voltage control region, is formed on the surface of an active region of the p-type semiconductor substrate 1 under the n-type semiconductor region 6A as a source and is set to an impurity concentration of, say, about $5\times10^{17}$ atoms/cm$^3$. The p-type semiconductor region 15 is formed by selectively introducing a p-type impurity into the surface of the p-type semiconductor substrate 1 as by ion implantation after the process of forming the first gate material (8, 20) but before the process of forming the n-type semiconductor region 6A as the source and the n-type semiconductor region 6B as the drain.

The width in the gate length direction of the active region of the p-type semiconductor substrate 1 is defined by a pair of thermally oxidized insulating films (field insulating films) 2 formed on the surface of the non-active region of the p-type semiconductor substrate 1. The paired thermally oxidized insulating films 2 are formed of a silicon oxide film made by a known selective oxidation method and is set to a thickness of about 500 nm. The paired thermally oxidized insulating films 2 extend in the direction of gate width and electrically isolate the nonvolatile memory cells Q from each other that are arranged along the word lines WL. In other words, the thermally oxidized insulating films 2 are used as cell isolation insulating films.

Under each of the thermally oxidized insulating films 2 is formed a p-type semiconductor region 12 as a channel stopper region, which may be set to an impurity concentration of about $4\times10^{17}$ atoms/cm$^3$.

The n-type semiconductor region 6A as a source and the n-type semiconductor region 6B as a drain are formed continuously in the direction of gate width so that they are formed integrally with the n-type semiconductor region 6A and n-type semiconductor region 6B of the nonvolatile memory cells Q arranged in the direction of gate width. The pair of n-type semiconductor regions 9 as the source and drain are formed continuously in the direction of gate width so that they are formed integrally with the pair of n-type semiconductor regions 9 as the source and drain of the nonvolatile memory cells Q arranged in the direction of gate width. That is, the source and drain of the nonvolatile memory cell Q are electrically connected to the source and drain of other nonvolatile memory cells Q.

The n-type semiconductor region 6A as the source and one n$^+$-type semiconductor region 9 as the source are used as a local source line (LSL). The n-type semiconductor region 6B as the drain and the other n$^+$-type semiconductor region 9 as the drain are used as a local data line LDL. In other words, the semiconductor integrated circuit device of this embodiment is formed in a structure in which the local data lines (LDL) are embedded in the p-type semiconductor substrate 1 and comprise AND-type flash memories.

On the surface of the p-type semiconductor substrate 1 between the thermally oxidized insulating film 2 and the first are formed of, for example, a polycrystalline silicon film, which is doped with an impurity during or after its deposition to reduce resistance.

Over the entire surface of the p-type semiconductor substrate 1 including the surfaces of the control gate electrodes G2 of the nonvolatile memory cells Q and the word lines WL is formed an interlayer insulating film 30, over which the data lines DL extend. The interlayer insulating film 30 is formed, for example, of a silicon oxide film, and the data lines DL are formed of a metal film such as an aluminum film or aluminum alloy film.

Figure 20:
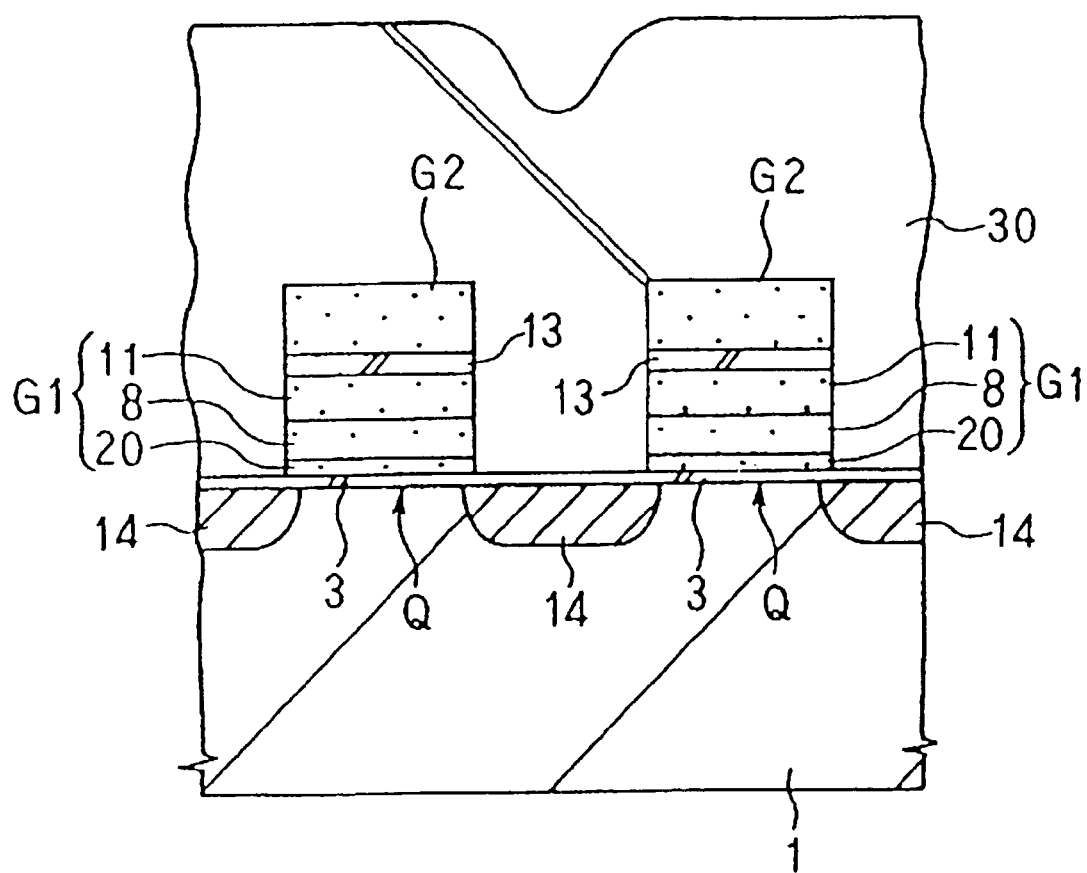
FIG. 20 is a cross section taken along the line B—B of FIG. 18.

In the surface of the p-type semiconductor substrate 1 between the nonvolatile memory cells Q arranged in the direction of gate width is formed a p-type semiconductor region 14 as a channel stopper, as shown in FIG. 20.

Next, the method of manufacturing the semiconductor integrated circuit device having the nonvolatile memory cells Q will be described by referring to FIGS. 21–23 (cross sections showing the manufacturing process) and FIGS. 24–27 (plan views showing the manufacturing process).

First, a p-type semiconductor substrate 1 of a single crystal silicon is prepared.

Figure 21:
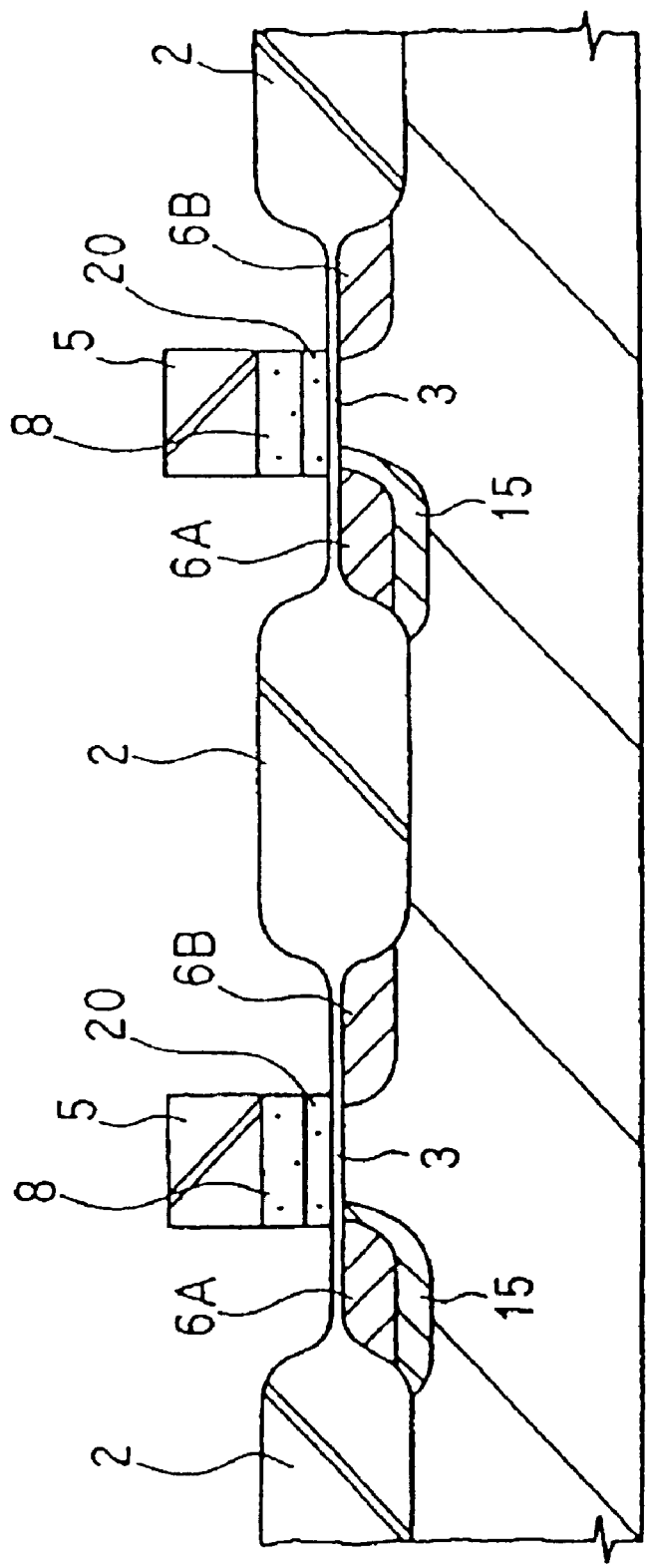
FIG. 21 is a cross section used to explain a process of manufacturing the semiconductor integrated circuit device.
Figure 23:
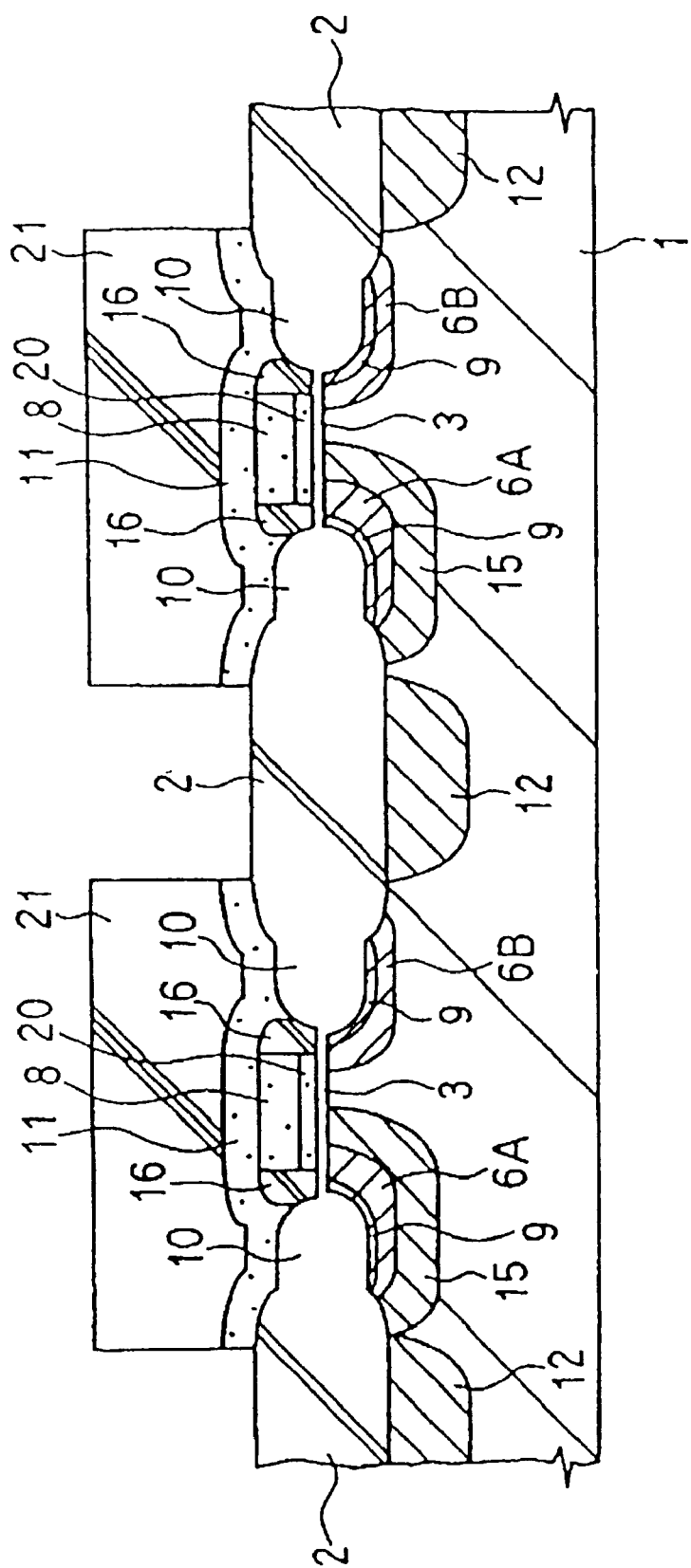
FIG. 23 is a cross section used to explain the process of manufacturing the semiconductor integrated circuit device.
Figure 24:
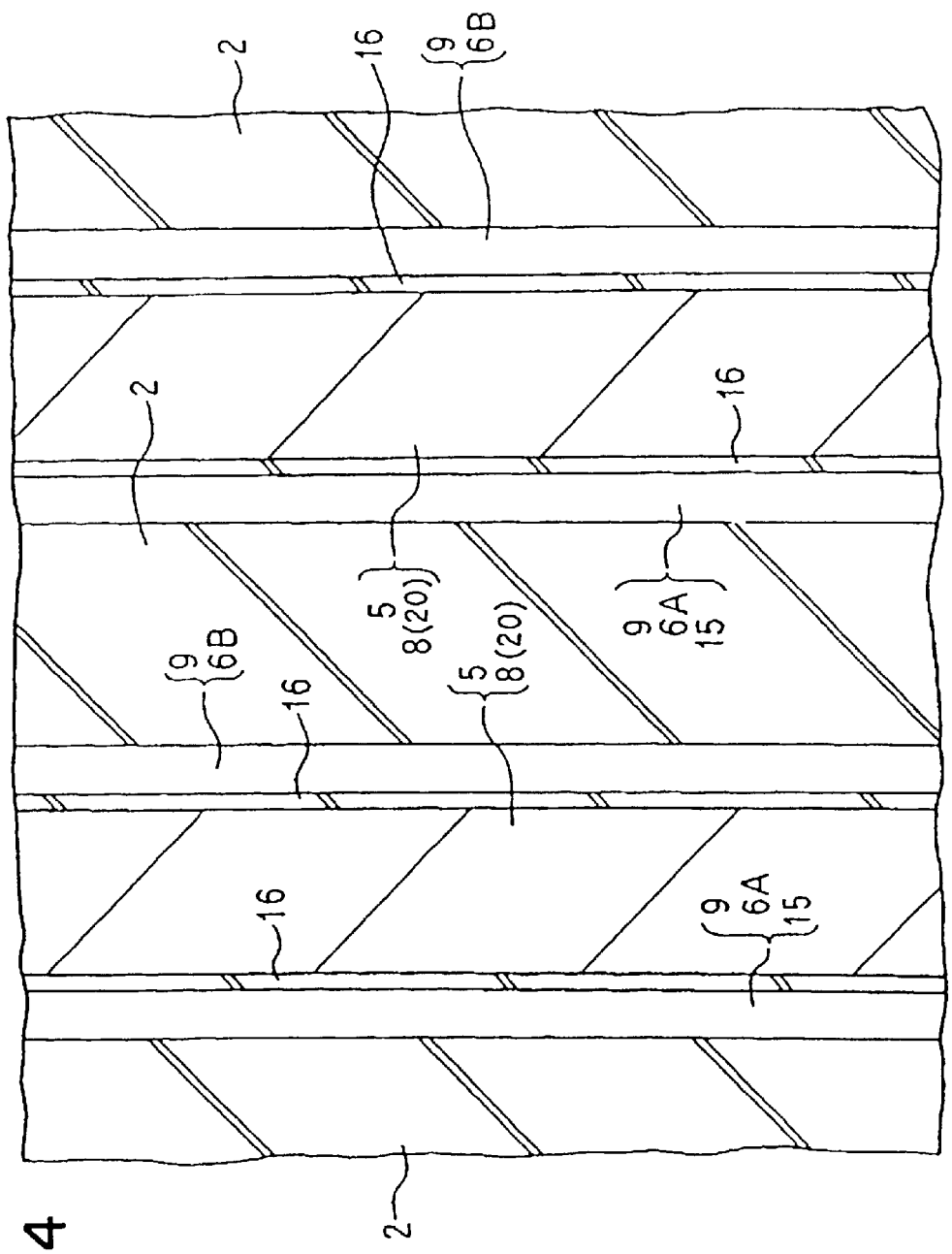
FIG. 24 is a cross section used to explain the process of manufacturing the semiconductor integrated circuit device.

Next, as shown in FIGS. 21 and 23, a pair of thermally oxidized insulating films (field insulating films) 2 are formed over the surface of non-active regions of the p-type semiconductor substrate 1. The paired thermally oxidized insulating films 2 are formed of, for example, a thermally oxidized silicon film made by a known selective oxidation gate material (8, 20) are formed a pair of thermally oxidized insulating films 10. The thermally oxidized insulating films 10 are formed on the surface of the n-type semiconductor region 6A, n-type semiconductor region 6B and a pair of n-type semiconductor regions 9. The paired thermally oxidized insulating films 10 extend in the direction of gate width and are formed by the thermal oxidation method to a thickness of, for example, about 150 nm.

The second gate material 11 of the floating gate electrode G1 is formed over the surface of the first gate material (8, 20) and over the surface of the thermally oxidized insulating films 10. That is, the width of the second gate material 11 in the direction of gate length is set larger than the width in the direction of gate length of the first gate material (8, 20) that defines the gate length of the floating gate electrode G1. By setting the width of the second gate material 11 in the gate length direction larger than the width of the first gate material (8, 20) in the gate length direction, it is possible to increase the area of the floating gate electrode G1 without increasing the gate length of the floating gate electrode G1. This increases the operation speed of the nonvolatile memory cells Q and also the amount of electric charge in the nonvolatile memory cells Q.

The control gate electrode G2 of the nonvolatile memory cell Q is formed integrally with the word line WL extending in the direction of gate length and is electrically connected to the control gate electrodes G2 of other nonvolatile memory cells Q. The control gate electrode G2 and the word line WL method and extends in the direction of gate width (Y direction). The paired thermally oxidized insulating films 2 define the width in the gate length direction (X direction) of the active region of the p-type semiconductor substrate 1.

Next, over the surface of the active region of the p-type semiconductor substrate 1 defined by the paired thermally oxidized insulating films 2 is formed a first gate insulating film 3, which is made of a silicon oxide film formed by the thermal oxidation method.

Next, over the entire surface of the substrate including the surfaces of the thermally oxidized insulating film 2 and the first gate insulating film 3 are formed an amorphous silicon film, to form film 20, a thermally oxidized insulating film and a polycrystalline silicon film, to form film 8, successively in that order by the method of Embodiment 1. The amorphous silicon film to form film 20 and the polycrystalline silicon film to form film 8 are silicon films not containing impurities. The amorphous silicon film to form film 20 has a thickness of 4 nm, and the thermally oxidized insulating film over the amorphous silicon film is a 0.5-nm thermally oxidized silicon film formed by thermally oxidizing the amorphous silicon film in a low-temperature, low-pressure oxygen atmosphere.

Next, over a part of the laminated film on the first gate insulating film 3, including the amorphous silicon film, the thermally oxidized silicon film and the polycrystalline silicon film, is formed an oxidation resistant layer, to form mask 5, that extends in the direction of gate width.

Next, the oxidation resistant layer is patterned to form oxidation resistant mask 5, and the laminated film is patterned to form a first gate material (8, 20) over a part of the surface of the first gate insulating film 3. The first gate material (8, 20) includes a remaining portion the amorphous silicon film, the thermally oxidized silicon film and the polycrystalline silicon film covered with the oxidation resistant mask 5 and has its width in the direction of gate length defined.

Next, a p-type impurity (for example, boron) is selectively introduced self-aligningly with respect to the thermally oxidized insulating film 2 and the oxidation resistant mask 5 into one of the surfaces of the p-type semiconductor substrate 1 between the thermally oxidized insulating film 2 and the oxidation resistant mask 5 to form a p-type semiconductor region 15 that serves as a threshold voltage control region. The p-type impurity is introduced at an angle of 60 degrees with respect to the surface of the p-type semiconductor substrate 1 with an acceleration energy of 100 keV and an injection amount of $1 \times 10^{14}$ atoms/cm$^3$.

Next, an n-type impurity (for example, arsenic) is selectively introduced self-aligningly with respect to the thermally oxidized insulating film 2 and the oxidation resistant mask 5 into one of the surfaces of the p-type semiconductor substrate 1 between the thermally oxidized insulating film 2 and the oxidation resistant mask 5 to form an n-type semiconductor region 6A as a source.

Next, an n-type impurity (for example, arsenic) is selectively introduced self-aligningly with respect to the thermally oxidized insulating film 2 and the oxidation resistant mask 5 into this one of the surfaces of the p-type semiconductor substrate 1 between the thermally oxidized insulating film 2 and the oxidation resistant mask 5 to form an n-type semiconductor region 6B as a drain.

Figure 22:
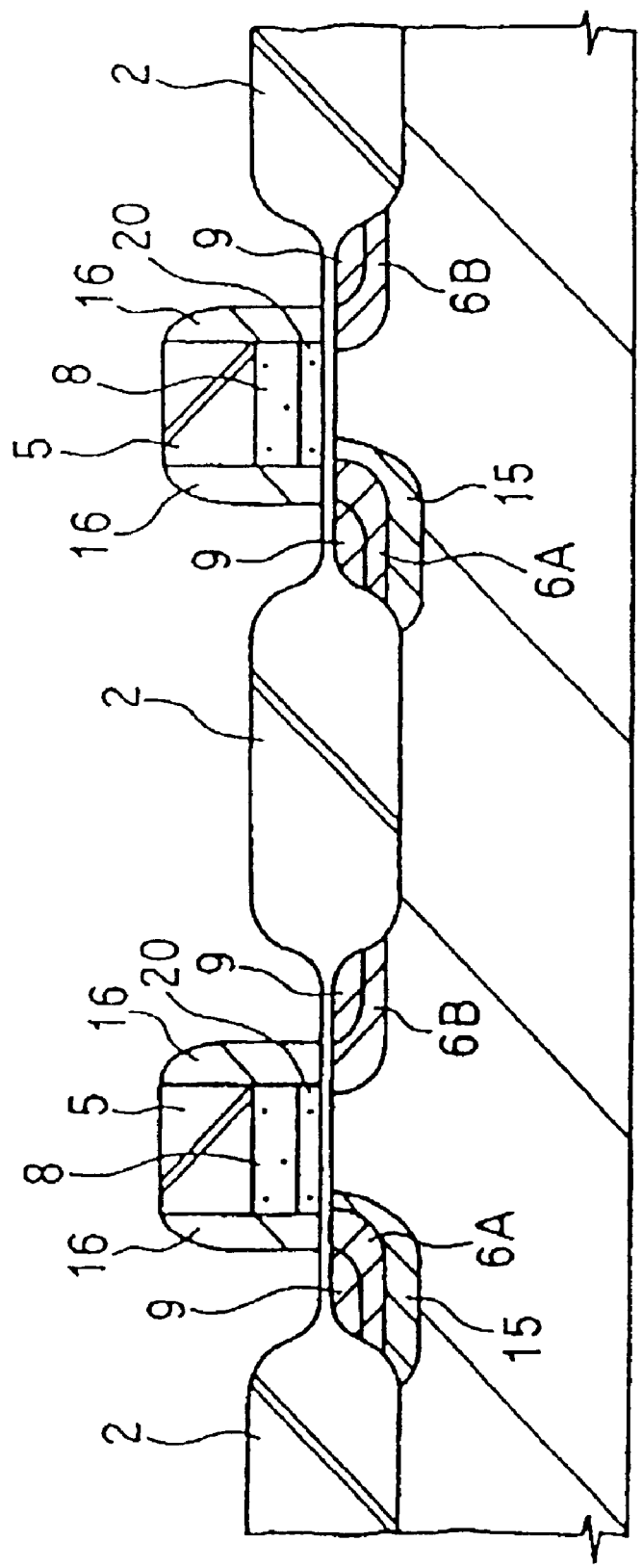
FIG. 22 is a cross section used to explain the process of manufacturing the semiconductor integrated circuit device.
Figure 25:
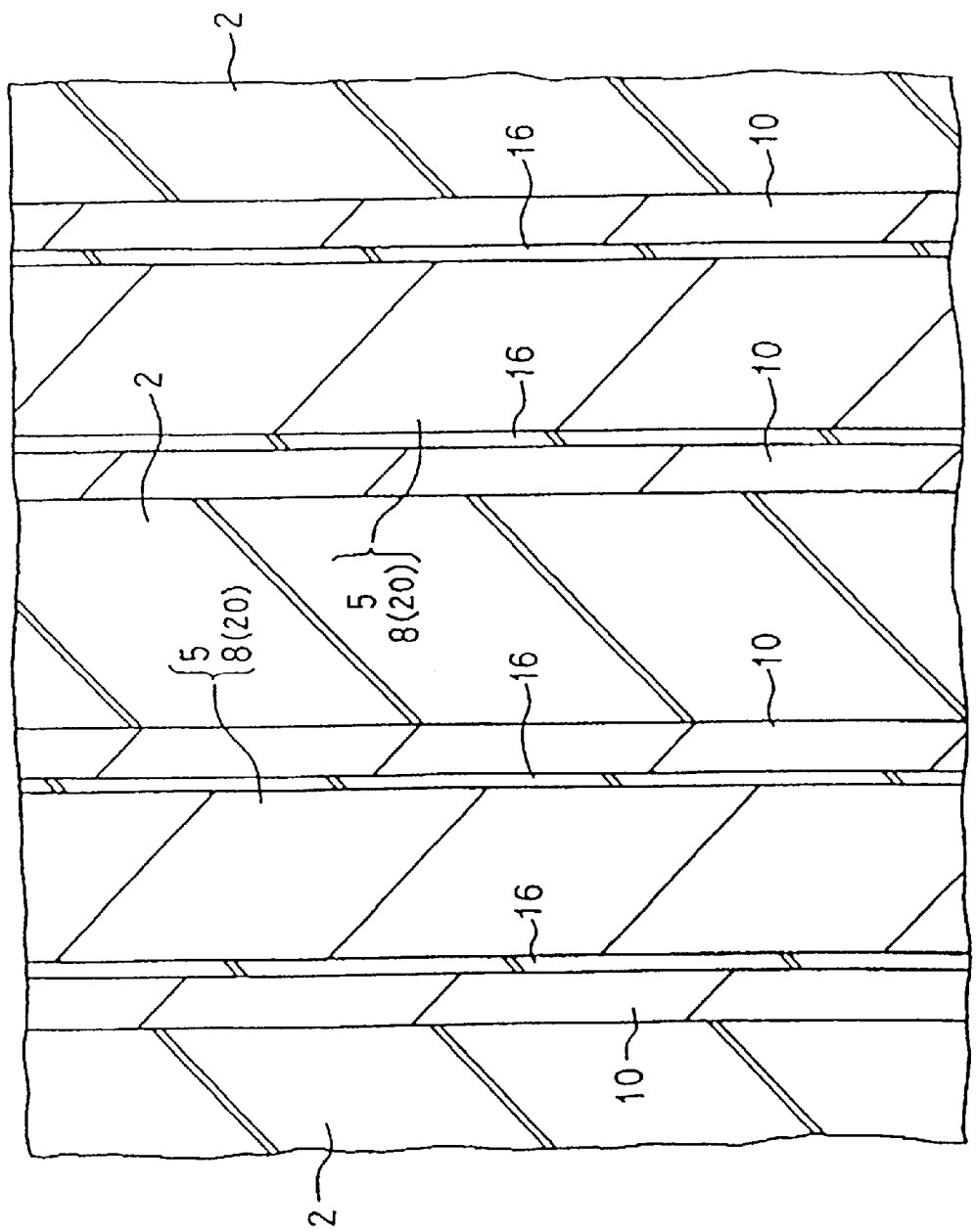
FIG. 25 is a cross section used to explain the process of manufacturing the semiconductor integrated circuit device.

Next, as shown in FIGS. 22 and 25, sidewall spacers 16 are formed on the sidewalls of the oxidation resistant mask 5 and first gate material (8, 20) in the direction of gate length. The sidewall spacers 16 are made of, for instance, a silicon oxide film. The sidewall spacers 16 are formed by depositing a silicon oxide film over the entire surface of the p-type semiconductor substrate 1 including the surface of the oxidation resistant mask 5, e.g., by a CVD (chemical vapor deposition) method and then performing anisotropic etching on the silicon oxide film.

Next, an n-type impurity (for example, phosphorus) is introduced self-aligningly with respect to the thermally oxidized insulating film 2 and the oxidation resistant mask 5 into the surface of the p-type semiconductor substrate 1 between the thermally oxidized insulating films 2 and the sidewall spacers 16 to form a pair of n-type semiconductor regions 9 as source and drain over the surfaces of the n-type semiconductor region 6A and the n-type semiconductor region 6B. The pair of n-type semiconductor regions 9 are set to have a higher impurity concentration than those of the n-type semiconductor regions 6A and 6B.

Next, the device is subjected to thermal oxidation to form a pair of thermally oxidized insulating films 10 (see, e.g., FIG. 23) over the surface of the p-type semiconductor substrate 1 between the thermally oxidized insulating films 2 and the sidewall spacers 16. The thermally oxidized insulating films 10 are set to be smaller in thickness than the thermally oxidized insulating film 2 but larger than the first gate insulating film 3. The thermal oxidation is performed in the presence of water vapor in an oxidation temperature range in which the surface reaction is very likely to determine the level of oxidation of the p-type semiconductor substrate 1.

In the oxidation processing, the 4-nm-thick amorphous silicon film in contact with the first gate insulating film 3 becomes a polycrystalline silicon film 20. At this time, the silicon oxide film formed over the amorphous silicon film surface is eliminated.

On the other hand, the above oxidation process produces between the first gate material (8, 20) and the p-type semiconductor substrate 1 a gate bird's beak (thermally oxidized insulating film) that grows from the gate-length-direction-oriented sidewalls of the first gate material (8, 20) toward its central portion. Variations of this gate bird's beak (thermally oxidized insulating film), however, are very small. This is because a low impurity concentration produces no oxidation rate increasing effect.

Further, because the thickness of the thermally oxidized insulating film 10 is set smaller than that of the thermally oxidized insulating film 2 formed by the selective oxidation method, the thermal processing time for forming the thermally oxidized insulating film 10 is shorter than that for forming the thermally oxidized insulating film 2.

Next, the mask 5 is removed. At this time a part of the sidewall spacers 16, too, is eliminated.

Next, a polycrystalline silicon film is formed, e.g., by CVD over the entire surface of the p-type semiconductor substrate 1 including the surfaces of the thermally oxidized insulating films 10 and the first gate material (8, 20). An impurity (for example, phosphorus) to reduce resistance is introduced into the polycrystalline silicon film during its deposition.

A mask 21 (see FIG. 23) whose width in the gate length direction is defined is formed over a part of the surface of the polycrystalline silicon film overlying the thermally oxidized insulating films 10 and the first gate material (8, 20). This mask is formed of, for example, a photoresist film and extends in the gate width direction.

Figure 26:
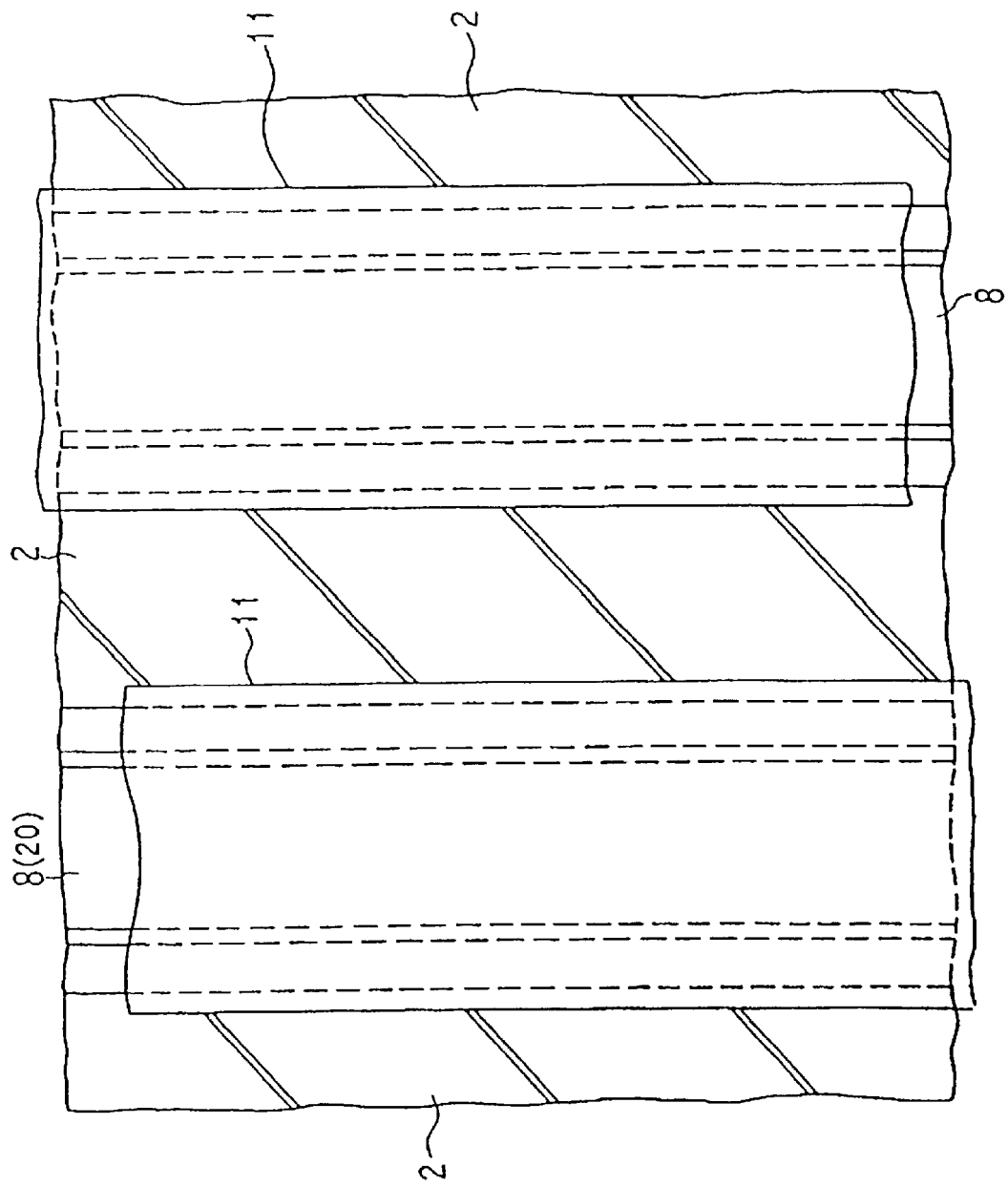
FIG. 26 is a cross section used to explain the process of manufacturing the semiconductor integrated circuit device.

Next, the polycrystalline silicon film is patterned to form over the surfaces of the thermally oxidized insulating films 10 and the first gate material (8, 20) a second gate material 11 made of an impurity-doped polycrystalline silicon film whose width in the gate length direction is defined, as shown in FIGS. 23 and 26.

Next, a p-type impurity is introduced, as by ion implantation, self-aligningly with respect to the mask 21 into the surface of the p-type semiconductor substrate 1 underlying the thermally oxidized insulating film 2 to form a p-type semiconductor region 12 as a channel stopper region. Then, the mask 21 is removed.

Next, the device is subjected to a thermal diffusion process to diffuse the impurity, introduced in the second gate material 11, into the first gate material (8, 20). The thermal diffusion is performed in an atmosphere at about 850° C. for about 10 minutes. This process reduces the resistance of the first gate material by the impurity diffused from the second gate material 11.

Next, the second gate insulating film 13 is formed over the surface of the second gate material 11. The second gate insulating film 13 is formed as a multi-layer film that includes a first silicon oxide film, a silicon nitride film and a second silicon oxide film, deposited successively as by the CVD method and laminated together.

Next, a third gate material is formed over the surface of the second gate insulating film 13. The third gate material is formed of, for example, a polycrystalline silicon film which is doped with an impurity to reduce resistance.

Figure 27:
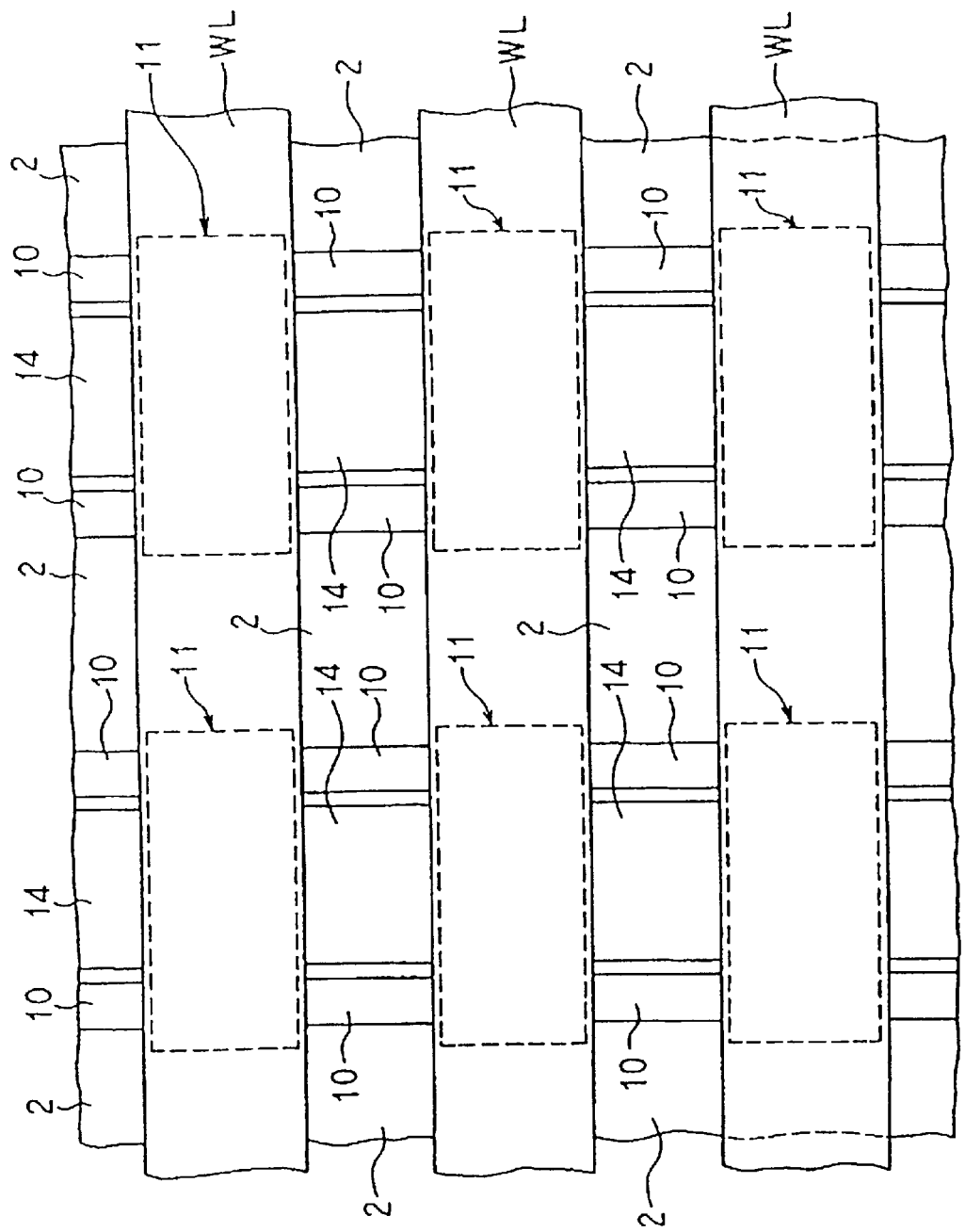
FIG. 27 is a cross section used to explain the process of manufacturing the semiconductor integrated circuit device.

Then, as shown in FIG. 27, the third gate material is patterned to define the width in the gate width direction, and the second gate material 11 and the first gate material (8, 20) are also patterned to define their width in the gate width direction to form control gate electrodes G2 and word lines (WL) of the third gate material and to form floating gate electrodes G1 of the second gate material 11 and first gate material (8, 20). This process nearly completes the nonvolatile memory cells Q.

Next, a p-type impurity is introduced into the surface of the p-type semiconductor substrate 1 between the nonvolatile memory cells Q and the other nonvolatile memory cells Q arranged in the gate width direction, in a self-aligning manner with respect to these control gate electrodes G2, to form p-type semiconductor regions 14 as channel stopper regions. With this process, the channel forming regions of the nonvolatile memory cells Q arranged in the gate width direction are isolated from one another by the p-type semiconductor regions 14.

Next, an interlayer insulating film 30 is formed over the entire surface of the p-type semiconductor substrate 1 including the word lines (WL) and the control gate electrodes G2. After this, the data lines (DL) are formed over the entire surface of the p-type semiconductor substrate 1 including the interlayer insulating film 30. The data lines DL are made of a metal film, such as an aluminum film or an aluminum alloy film.

After the process of forming a polycrystalline silicon film as by the CVD method over the entire surface of the p-type semiconductor substrate 1 including the surfaces of the thermally oxidized insulating films 10 and the first gate material (8, 20) but before the process of forming the mask 21, a process of introducing an impurity (such as phosphorus) into the polycrystalline silicon film may be added.

The nonvolatile memory cells Q of this structure can reduce to below 5 nm variations of gate bird's beak that grows between the first gate material (8, 20) and the p-type semiconductor substrate 1 from the sidewalls of the first gate material (8, 20) in the gate length direction toward its central portion. The reduction in the variations of the gate bird's beak can in turn suppress variations of the threshold voltage after the write operation.

The effective channel length of the nonvolatile memory cells Q is 0.3 nm, the threshold voltage as measured from the control gate electrode G2 is 1.5 V, and the punch-through voltage is 8 V.

The operation of writing data into the nonvolatile memory cells Q involves applying a reference voltage of −4 V to the p-type semiconductor substrate 1 and applying an operation voltage (write voltage pulse) of 12 V with a pulse width of 0.5 ms to the control gate electrode G2 to inject a tunneling current from the entire surface of the channel region into the floating gate electrode G1. The threshold voltage after the write operation rises to 6 V. The data erase operation is done by applying an operation voltage of −9 V to the control gate electrode G2 and applying an operation voltage (erase voltage pulse) of 5 V with a pulse width of 0.5 ms to the drain to release the tunneling current from the floating gate electrode G1 to the drain. The threshold voltage after the erase operation falls to 1 V. The results of these write/erase tests on the semiconductor integrated circuit device having the capacity of 1 Mbit show that variations of the write/erase operation voltages, designed to produce a predetermined threshold voltage shift, can be suppressed to about 0.02 V.

With the semiconductor integrated circuit device having nonvolatile memory cells of this embodiment, the F-N current can be increased by using a predetermined amorphous silicon film for the first gate material.

Further, this embodiment can reduce the impurity concentration in the gate electrode material in contact with the gate insulating film and also reduce variations of the area of overlapping regions caused by gate bird's beaks, thereby making the F-N current uniform.

Furthermore, this embodiment offers the following advantages.

(1) The dimensional precision of the width of the first gate material (8, 20) in the direction of gate length can be enhanced. This in turn enhances the dimensional precision of the gate length of the floating gate electrode G1 that is defined by the width in the gate length direction of the first gate material. As a result, not only can variations in the area of overlapping regions between the floating gate electrode G1 and the drain be reduced, but variations in the area of overlapping regions between the floating gate electrode and the source can also be reduced. This makes the write and erase characteristics of the nonvolatile memory cells Q uniform.

Further, in the nonvolatile memory cells Q that utilize the tunneling effect in performing the write and erase operations, variations in the threshold voltage after the write operation can be reduced. This in turn increases the operation margin of the nonvolatile memory cells Q for variation of power supply voltage.

Because nonvolatile memory cells Q with uniform characteristics can be fabricated in semiconductor chips and in semiconductor wafers, it is possible to stably manufacture highly reliable, large capacity semiconductor integrated circuit devices.

(2) The length of a diffusion area can be reduced in which the impurity, introduced self-aligningly with respect to the oxidation resistant mask 5, diffuses into the channel forming region under the first gate material (8, 20), which in turn secures a sufficient effective channel length between source and drain. This in turn enhances the punch-through resistance of the nonvolatile memory cells Q.

(3) The dimensional precision of the width of the first gate material (8, 20) in the gate length direction can be further enhanced. This allows a further reduction in variations of the area of overlapping regions between the floating gate electrode G1 and the drain, making the write and erase characteristics of the nonvolatile memory cells Q even more uniform.

In a process prior to forming the second gate material 11, it is possible to form the first gate material (8) by using an amorphous silicon film doped with an impurity concentration of $1 \times 10^{19}$ atoms/cm$^3$. This produces an effect similar to that when the first gate material (8) is formed of a polycrystalline silicon film doped with an impurity concentration of $1 \times 10^{19}$ atoms/cm$^3$.

A variation of this embodiment for increasing the capacity of the nonvolatile memory cells Q can also be implemented. The outline configuration of a semiconductor integrated circuit device of this variation is shown in FIG. 28 (cross section).

Figure 28:
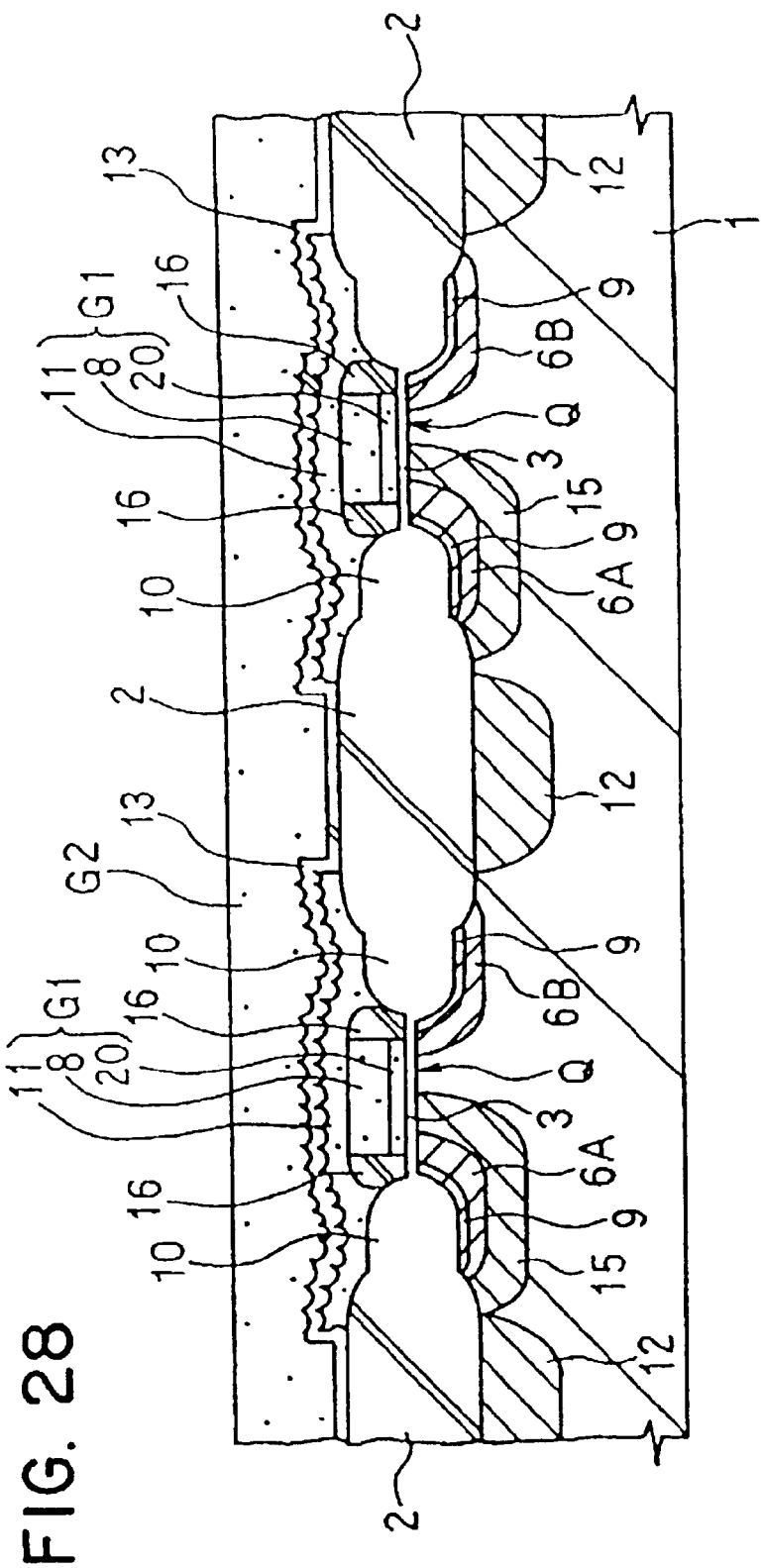
FIG. 28 is a cross section showing a variation of the memory cell shown in the fourth embodiment.
Figure 29:
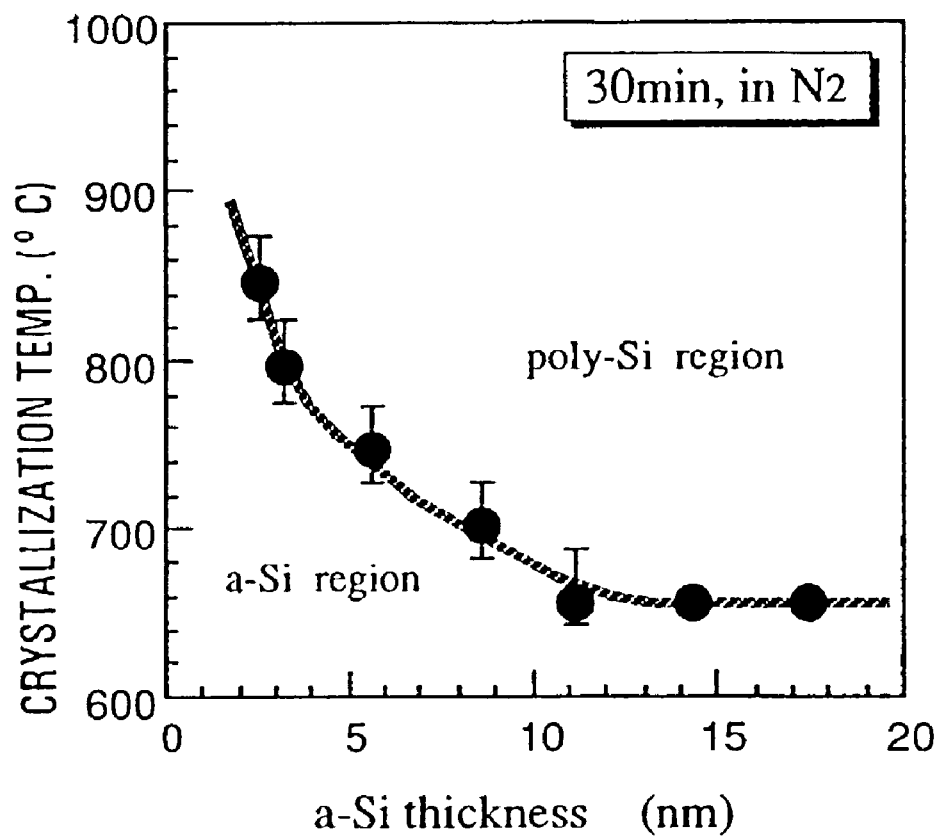
FIG. 29 is a diagram showing a relationship between thickness of an amorphous silicon film and crystallization temperature thereof.

As shown in FIG. 28, the semiconductor integrated circuit device has nonvolatile memory cells Q that perform the write and erase operations based on the tunneling effect. The nonvolatile memory cell Q comprises mainly a p-type semiconductor substrate 1 that constitutes a channel forming region, a first gate insulating film 3, a floating gate electrode G1, a second gate insulating film 13, a control gate electrode G2, an n-type semiconductor region 6A as a source, an n-type semiconductor region 6B as a drain, a pair of n+type semiconductor regions 9 as source and drain, and a p-type semiconductor region 15 as a threshold voltage control region.

The floating gate electrode G1, as in the preceding example, comprises a first gate material (8, 20) and a second gate material 11 stacked over the surface of the first gate material (8, 20). The second gate material 11 is formed of a polycrystalline silicon film doped with phosphorus as an impurity to reduce resistance.

The second gate material 11 has a rough surface. This rough surface of the second gate material 11 is formed by dipping the p-type semiconductor substrate 1 in a phosphoric acid liquid before the process of forming the second gate insulating film 13. The process of submerging the p-type semiconductor substrate 1 in the phosphoric acid liquid involves dipping it in a phosphoric acid liquid ($H_3PO_4$) at around 140–160° C. for about 60 minutes.

In this way, after the process of forming the second gate material 11 using a polycrystalline silicon film doped with phosphorus but before the process of forming the second gate insulating film 13, a process of dipping the p-type semiconductor substrate 1 in a phosphoric acid liquid is added to roughen the surface of the second gate material 11. This increases the surface area of the second gate material 11. As a result, the surface of the floating gate electrode G1 can be increased, which in turn increases the amount of electric charge in the nonvolatile memory cell Q.

The roughened surface of the second gate material 11 can also be formed by depositing hemispherical grains (HSG), e.g., of polycrystalline silicon, by a CVD method.

Representative features or advantages of this invention may be summarized as follows.

The write/erase current (F-N current) can be increased substantially without increasing the low electric field leakage current of a flash memory as represented by a nonvolatile semiconductor device. The increase in the write/erase current (F-N current) improves the write/erase time.

Further, the breakdown time of the gate insulating film improves significantly.

With these features, it is possible to provide a highly reliable nonvolatile semiconductor memory device having the write/erase time significantly improved over those of conventional devices.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A method of manufacturing a semiconductor device having non-volatile memory cells, each of the non-volatile memory cells including a floating gate electrode formed over a surface of an active region of a semiconductor substrate through a first gate insulating film and a control gate electrode formed over a surface of the floating gate electrode through a second gate insulating film, comprising the steps of:

(a) forming a first film of an amorphous silicon, a polycrystalline silicon, or a combination of amorphous and polycrystalline silicon materials, the first film having an average thickness of less than 8 nm, over a part of a surface of the first gate insulating film and then forming an insulating film and then a polycrystalline silicon film over the surface of a first film;

(b) forming a first gate material by removing a portion of the polycrystalline silicon film and the first film, during which removing a surface of the polycrystalline silicon film is covered with an oxidation resistant mask, so as to form the first gate material whose width in a direction of gate length is defined;

(c) performing a heat treatment to form a thermally oxidized insulating film over the surface of the active region of the semiconductor substrate;

(d) removing the oxidation resistant mask;

(e) forming over surfaces of the thermally oxidized insulating film and the first gate material a second gate material made of a silicon film whose width in the direction of gate length is defined;

(f) forming a second gate insulating film over a surface of the second gate material; and (g) forming a third gate material over a surface of the second gate insulating film.

2. A method according to claim 1, wherein said insulating film has a thickness of 0.3 to 1 nm.

3. A method according to claim 2, wherein said insulating film is a silicon oxide film.

4. A method according to claim 3, wherein the silicon oxide film is a native oxide film.

5. A method according to claim 1, wherein the insulating film is a native oxide film.

6. A method according to claim 1, wherein during said performing heat treatment to form the thermally oxidized insulating film, the insulating film is eliminated.

7. A method according to claim 1, wherein the width of the second gate material is greater than the width of the first gate material in the direction of the gate length.

8. A method of manufacturing a semiconductor device having non-volatile memory cells, each of the non-volatile memory cells including a floating gate electrode formed over a surface of an active region of a semiconductor substrate through a first gate insulating film and a control gate electrode formed over a surface of the floating gate electrode through a second gate insulating film, comprising the steps of:

(a) forming over a part of a surface of the first gate insulating film a first gate material, in which an amorphous silicon film, a polycrystalline silicon film or a film of a combination of amorphous and polycrystalline silicon materials, with an average thickness of less than 10 nm, is formed as a first layer over the first gate insulating film, in which a surface of an uppermost layer of the first gate material is covered with an oxidation resistant mask, and in which a width in a direction of gate length is defined;

(b) performing a heat treatment to form a thermally oxidized insulating film over the surface of the active region of the semiconductor substrate;

(c) removing the oxidation resistant mask;

(d) forming over surfaces of the thermally oxidized insulating film and the first gate material a second gate material made of a silicon film whose width in the direction of gate length is defined;

(e) forming a second gate insulating film over a surface of the second gate material; and (f) forming a third gate material over a surface of the second gate insulating film, wherein said first layer of the first gate material has a second, conductive layer formed thereover, said second, conductive layer constituting Dart of the first gate material, and wherein an insulating film is formed on the first layer, between the first layer and second, conductive layer.

9. A method according to claim 8, wherein said second, conductive layer is made of polycrystalline silicon.

10. A method according to claim 9, wherein said insulating film has a thickness of 0.3 to 1 nm.

11. A method according to claim 10, wherein said insulating film is a silicon oxide film.

12. A method of manufacturing a semiconductor device, comprising the steps of:

forming an amorphous silicon film, the amorphous silicon film having a thickness; and forming an insulating film over a surface of the amorphous silicon film at a temperature such that the amorphous silicon film does not crystallize, said temperature being less than a crystallization temperature based upon the thickness of the amorphous silicon film;

wherein subsequent processes, after forming the insulating film, are performed at temperatures such that the amorphous silicon film does not crystallize, said temperatures being less than the crystallization temperature based upon the thickness of the amorphous silicon film.

13. A method according to claim 12, wherein the amorphous silicon film is formed by chemical vapor deposition, using disilane as a source gas at a temperature less than 480° C.

14. A method according to claim 12, wherein the amorphous silicon film is formed to have a thickness of less than 8 nm.

15. A method according to claim 12, wherein the amorphous silicon film has a thickness of at most 5 nm, and temperatures of said forming the insulating film and said subsequent processes are at most about 750° C.

16. A method according to claim 12, wherein the amorphous silicon film has a thickness of at most 3 nm, and temperatures of said forming the insulating film and said subsequent processes are at most about 800° C.

17. A method according to claim 12, wherein the amorphous silicon film has a thickness of at most 2 nm, and temperatures of said forming the insulating film and said subsequent processes are at most about 850° C.

18. A method of manufacturing a semiconductor device, comprising the steps of:

forming a first film, of an electrode, over a gate insulating film on a semiconductor substrate, the first film being made of a material selected from the group consisting of amorphous silicon, polycrystalline silicon and a mixture thereof, the first film having a thickness of less than 10 nm;

forming an insulating film on the first film;

forming a conductive second film, of said electrode, on the insulating film, the conductive second film being thicker than the first film; and performing a heat treatment, wherein during said heat treatment the insulating film is eliminated.

19. A method according to claim 18, wherein said insulating film has a thickness of 0.3 to 1 nm.

20. A method according to claim 19, wherein said insulating film is a silicon oxide film.

21. A method according to claim 18, wherein said first film has a thickness of less than 8 nm.

22. A method according to claim 18, wherein said heat treatment is performed after forming the conductive second film.

23. A method of manufacturing a semiconductor device, comprising the steps of:

forming a first film, of an electrode, over a gate insulating film on a semiconductor substrate, the first film being made of amorphous silicon;

forming an insulating film on the first film;

forming a conductive second film, of said electrode, on the insulating film, the conductive second film being thicker than the first film and performing a heat treatment, wherein during said heat treatment the insulating film is eliminated.

24. A method according to claim 23, wherein the conductive second film has impurities doped therein, and during said heat treatment impurities in the conductive second film diffuse into the first film.

25. A method according to claim 23, wherein said heat treatment is performed after forming the conductive second film.

* * * * *